United States Patent
Suganuma et al.

(10) Patent No.: US 11,049,840 B2
(45) Date of Patent: Jun. 29, 2021

(54) BONDING DEVICE

(71) Applicant: OSAKA UNIVERSITY, Osaka (JP)

(72) Inventors: Katsuaki Suganuma, Suita (JP); Shijo Nagao, Suita (JP); Akio Shimoyama, Suita (JP); Shinya Seki, Suita (JP)

(73) Assignee: OSAKA UNIVERSITY, Osaka (JP)

( * ) Notice: Subject to any disclaimer, the term of this patent is extended or adjusted under 35 U.S.C. 154(b) by 211 days.

(21) Appl. No.: 16/324,528

(22) PCT Filed: Jun. 16, 2017

(86) PCT No.: PCT/JP2017/022285
§ 371 (c)(1),
(2) Date: Feb. 8, 2019

(87) PCT Pub. No.: WO2018/029983
PCT Pub. Date: Feb. 15, 2018

(65) Prior Publication Data
US 2019/0189587 A1    Jun. 20, 2019

(30) Foreign Application Priority Data
Aug. 12, 2016 (JP) .............................. JP2016-158565

(51) Int. Cl.
*B23K 1/00* (2006.01)
*B23K 3/00* (2006.01)
(Continued)

(52) U.S. Cl.
CPC ............ *H01L 24/75* (2013.01); *B23K 1/0008* (2013.01); *H01L 21/52* (2013.01); *H01L 24/83* (2013.01);
(Continued)

(58) Field of Classification Search
CPC . H01L 2224/85205; H01L 2224/78301; H01L 2224/851; H01L 2224/85201;
(Continued)

(56) References Cited

U.S. PATENT DOCUMENTS

| 3,186,446 A | 6/1965 | Hunt |
| 3,738,560 A * | 6/1973 | Kulicke, Jr. ...... H01L 21/67144 |
| | | 228/10 |

(Continued)

FOREIGN PATENT DOCUMENTS

| JP | S61-050338 A | 3/1986 |
| JP | H09-246296 A | 9/1997 |

(Continued)

OTHER PUBLICATIONS

International Search Report issued in PCT/JP2017/022285; dated Jul. 25, 2017.

(Continued)

*Primary Examiner* — Erin B Saad
(74) *Attorney, Agent, or Firm* — Studebaker & Brackett PC

(57) ABSTRACT

A bonding device (100) bonds at least one component (C) to a substrate (B) using a metal material (M). The bonding device (100) includes a wall section (20), at least one pressing section (40), and a rotational shaft (30). The rotational shaft (30) is fixed to the wall section (20). Each pressing section (40) has an arm (42) and a presser (43) or a substrate supporting member (90). The arm (42) extends from the rotational shaft (30). The arm (42) pivots about the rotational shaft (30). The presser (43) presses the component (C). The substrate supporting member (90) is disposed on a reference surface (142). The substrate supporting member (90) supports the substrate (B). The component (C) is bonded to the substrate (B) through point contact of the (Continued)

presser (43) with the component (C) or point contact of the substrate supporting member (90) with the reference surface (142).

14 Claims, 19 Drawing Sheets

(51) Int. Cl.
*H01L 23/00* (2006.01)
*H01L 21/52* (2006.01)
*B23K 101/40* (2006.01)

(52) U.S. Cl.
CPC .......... *H01L 24/95* (2013.01); *B23K 2101/40* (2018.08); *H01L 24/29* (2013.01); *H01L 2224/29339* (2013.01); *H01L 2224/32013* (2013.01); *H01L 2224/32245* (2013.01); *H01L 2224/753* (2013.01); *H01L 2224/7555* (2013.01); *H01L 2224/7598* (2013.01); *H01L 2224/75102* (2013.01); *H01L 2224/75272* (2013.01); *H01L 2224/75304* (2013.01); *H01L 2224/75822* (2013.01); *H01L 2224/8384* (2013.01); *H01L 2924/10272* (2013.01); *H01L 2924/12032* (2013.01); *H01L 2924/3511* (2013.01)

(58) Field of Classification Search
CPC ........ H01L 2224/78353; B23K 20/005; B23K 20/10; B23K 20/004; B23K 20/007
See application file for complete search history.

(56) References Cited

U.S. PATENT DOCUMENTS

| | | | | |
|---|---|---|---|---|
| 4,551,965 A | * | 11/1985 | Prottengeier | B29C 65/18 156/164 |
| 5,603,445 A | * | 2/1997 | Hill | B06B 3/00 228/1.1 |
| 2009/0020229 A1 | | 1/2009 | Yoon et al. | |

FOREIGN PATENT DOCUMENTS

| | | |
|---|---|---|
| JP | 2000-299357 A | 10/2000 |
| JP | 2004-281476 A | 10/2004 |
| JP | 2007-294608 A | 11/2007 |
| JP | 2011-071301 A | 4/2011 |
| JP | 2012-084740 A | 4/2012 |
| WO | 2012/050096 A1 | 4/2012 |

OTHER PUBLICATIONS

Communication pursuant to Article 94(3) EPC issued by the European Patent Office dated Jul. 9, 2020, which corresponds to European Patent Application No. 17 839 058.9-1212 and is related to U.S. Appl. No. 16/324,528.

The partial supplementary European search report issued by the European Patent Office dated Jul. 23, 2019, which corresponds to European Patent Application No. 17839058.9 and is related to U.S. Appl. No. 16/324,528.

* cited by examiner

BONDING DEVICE

TECHNICAL FIELD

The present invention relates to a bonding device.

BACKGROUND ART

Patent Literature 1 discloses a method for bonding members together using a paste. The paste includes a dispersion medium, and metal nanoparticles (metal material) are dispersed in the dispersion medium. The bonding method disclosed in Patent Literature 1 can make a bonding layer as thick as necessary by employing spacers. The bonding method enables pressurization at high pressure, and thus increases bonding strength to be obtained after sintering.

CITATION LIST

Patent Literature

[Patent Literature 1]
Japanese Patent Application Laid-Open Publication No. 2011-71301

SUMMARY OF INVENTION

Technical Problem

However, a bonding device disclosed in Patent Literature 1 may allow a pressing plate thereof to warp due to face contact between the pressing plate and the members being pressed. It has therefore been difficult to apply uniform pressure to the entire area of each member.

The present invention has been made in view of the problems described above, and an object thereof is to provide a bonding device capable of applying uniform pressure to the entire area of a component.

Solution to Problem

A bonding device according to the present invention bonds at least one component to a substrate using a metal material. The bonding device includes a wall section, at least one pressing section, and a rotational shaft. The rotational shaft is fixed to the wall section. The at least one pressing section has an arm and a presser or a substrate supporting member. The arm extends from the rotational shaft. The arm pivots about the rotational shaft. The presser presses the at least one component. The substrate supporting member is disposed on a reference surface. The substrate supporting member supports the substrate. The bonding device bonds the at least one component to the substrate through point contact of the presser with the at least one component or point contact of the substrate supporting member with the reference surface.

In an embodiment, the presser has a pressing surface that presses the at least one component. The pressing surface is downwardly convex.

In an embodiment, the pressing surface is a portion of a spherical surface.

In an embodiment, the bonding device bonds the at least one component to the substrate through point contact of the presser with a central region of the at least one component.

In an embodiment, the at least one pressing section further has a weight attached to the arm. The presser is located between the rotational shaft and the weight.

In an embodiment, the arm is attachable to and detachable from the rotational shaft.

In an embodiment, the rotational shaft has an arm attachment section to which the arm is attached. The arm attachment section has a cylindrical shape having a cutaway portion. The arm is attached to the arm attachment section. A peripheral surface of the arm attachment section has an arc-shaped section and a flat section. The arc-shaped section has an arc shape. The flat section is connected with the arc-shaped section. The flat section is flat. The arm has a rotational shaft holding section. The rotational shaft holding section has an arc-shaped section, a first flat section, and a second flat section. The arc-shaped section of the rotational shaft holding section has an arc shape. The first flat section is connected with one end of the arc-shaped section of the rotational shaft holding section. The first flat section is flat. The second flat section is connected with another end of the arc-shaped section of the rotational shaft holding section. The second flat section is flat. A diameter of a circle defining the arc-shaped section of the arm attachment section is greater than a distance between the first flat section of the rotational shaft holding section and the second flat section of the rotational shaft holding section. A length obtained as a sum of a radius of the circle defining the arc-shaped section of the arm attachment section and a shortest distance from a center of the circle defining the arc-shaped section of the arm attachment section to the flat section of the arm attachment section is equal to or shorter than the distance between the first flat section of the rotational shaft holding section and the second flat section of the rotational shaft holding section.

In an embodiment, the rotational shaft further has a pair of arm movement restriction sections. The pair of arm movement restriction sections restricts movement of the arm in an axial direction of the rotational shaft. The arm attachment section is defined by the pair of arm movement restriction sections.

In an embodiment, the bonding device further includes a support base that supports the substrate. The support base fixes a position of the substrate. The support base has a higher thermal conductivity than the arm.

In an embodiment, an extending direction of the arm is parallel to a horizontal direction when the presser is in point contact with the at least one component.

In an embodiment, the presser is an elastic body.

In an embodiment, the elastic body includes a fluororesin.

In an embodiment, the at least one component is a plurality of components. The at least one pressing section is a plurality of pressing sections. Each of the pressing sections presses a corresponding one of the components.

In an embodiment, the at least one pressing section is a first pressing section and a second pressing section. The arm of the second pressing section has an opening that allows the presser of the first pressing section to pass therethrough.

In an embodiment, the arm further has a contact section that comes in contact with the presser. The contact section has a movable section. The movable section is movable about a fixed point. The bonding device bonds the at least one component to the substrate through point contact of the presser with the movable section.

Advantageous Effects of Invention

According to the present invention, it is possible to apply uniform pressure to the entire area of a component.

DESCRIPTION OF EMBODIMENTS

Figure 1:
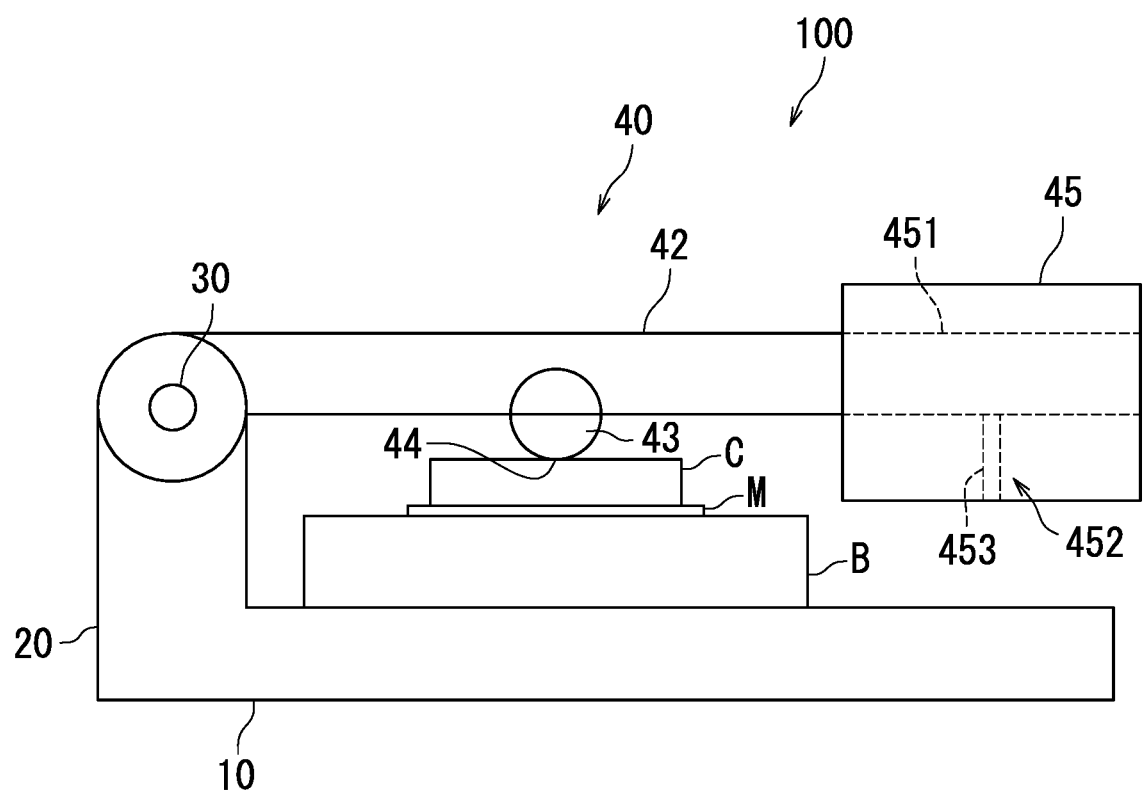
FIG. 1 is a schematic side view of a bonding device according to an embodiment of the present invention.

The following describes embodiments of the present invention with reference to the drawings. Elements that are the same or equivalent are indicated in the drawings using the same reference signs and description thereof will not be repeated.

Figure 2A:
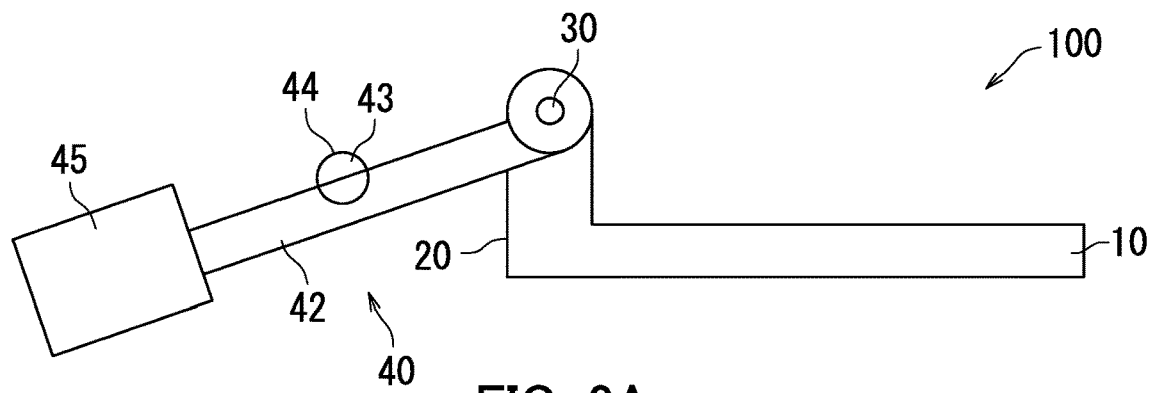
FIG. 2A to 2D are schematic side views of the bonding device according to the embodiment of the present invention for illustrating a bonding method thereof.
Figure 2B:
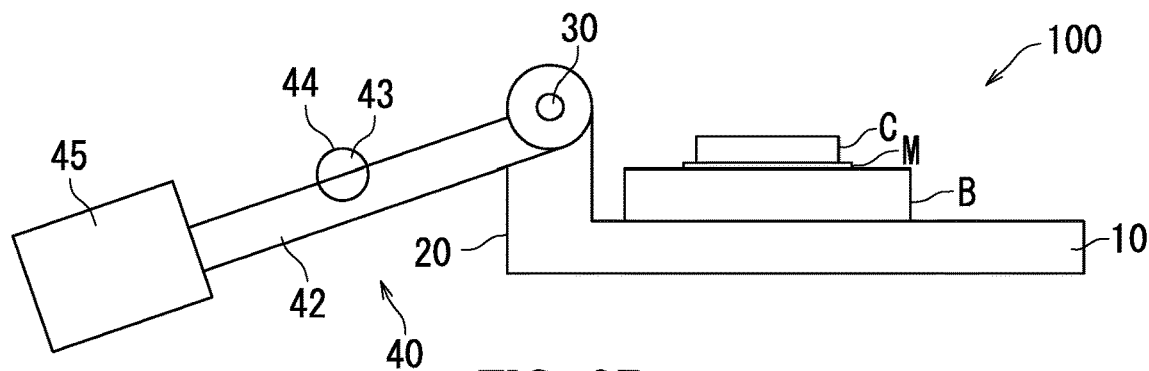
Figure 2C:
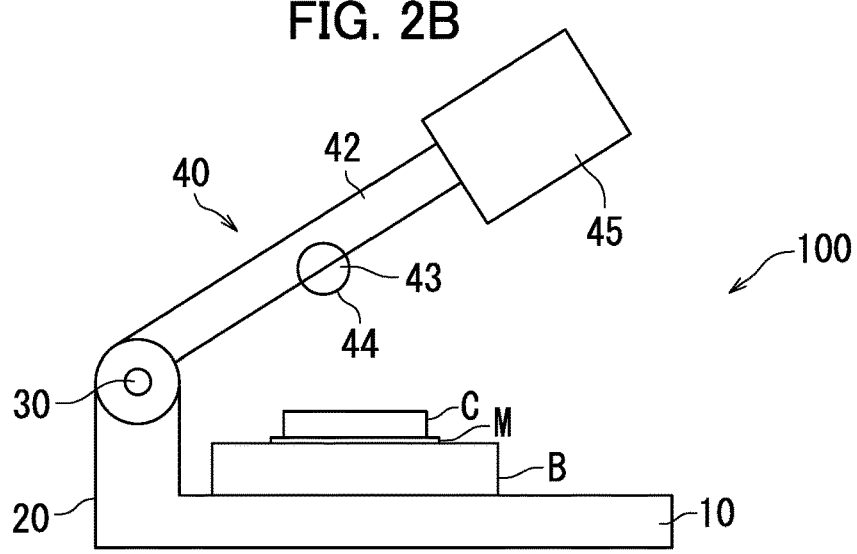
Figure 2D:
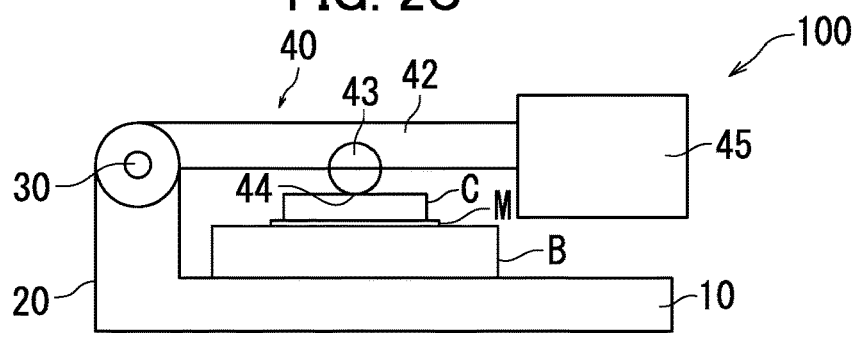
Figure 3:
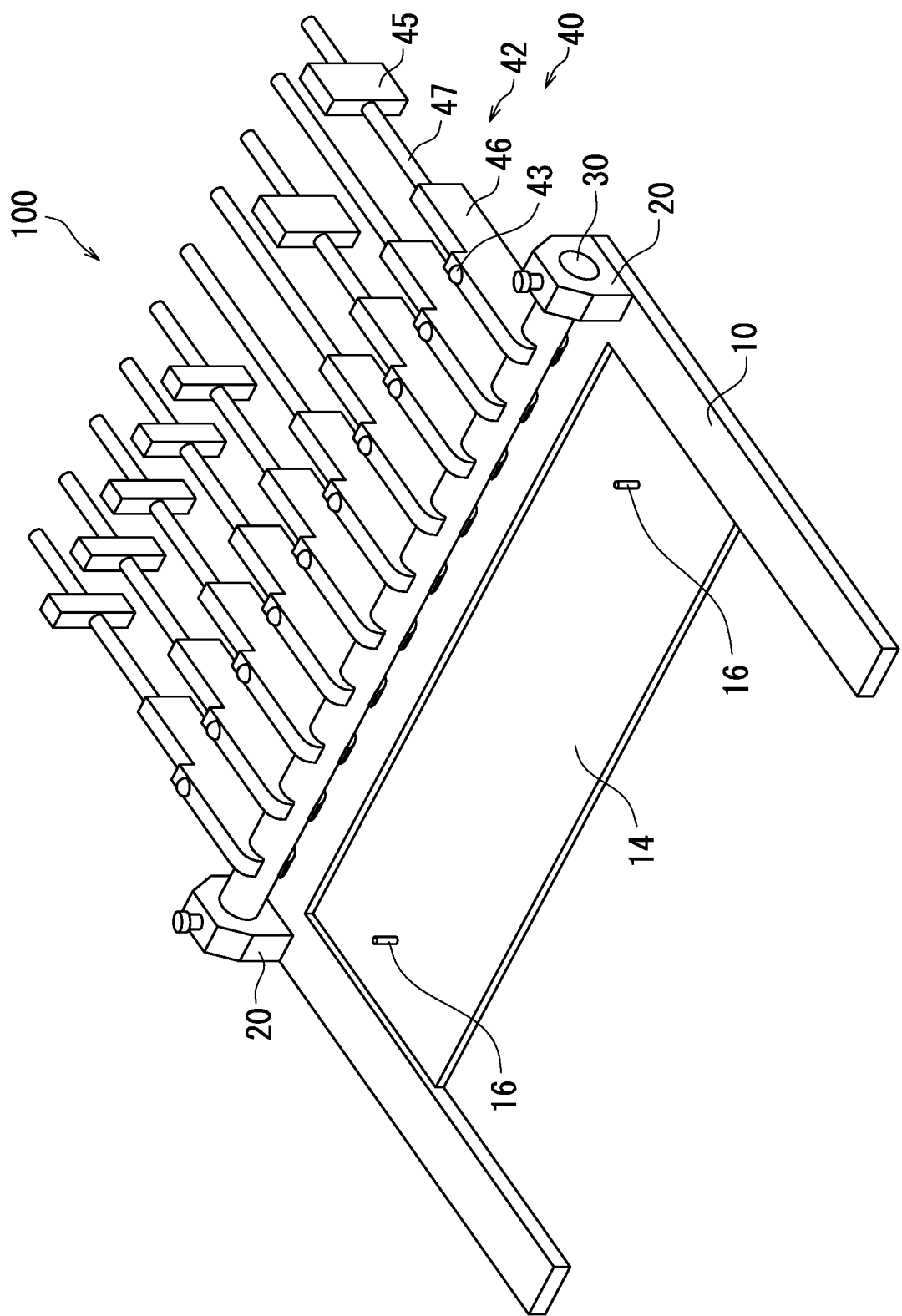
FIG. 3 is a perspective view of the bonding device according to the embodiment of the present invention.

The following describes a bonding device 100 according to an embodiment of the present invention with reference to FIGS. 1 to 3. FIG. 1 is a schematic side view of the bonding device 100 according to the embodiment of the present invention. FIGS. 2A to 2D are schematic side views of the bonding device 100 according to the embodiment of the present invention for illustrating a bonding method thereof. FIG. 3 is a perspective view of the bonding device 100 according to the embodiment of the present invention.

As illustrated in FIG. 1, the bonding device 100 includes a frame 10, a wall section 20, a rotational shaft 30, and a plurality of pressing sections 40. The bonding device 100 bonds components C to a substrate B using a metal material M.

The metal material M contains particles of a metal dispersed therein, such as silver, copper, or nickel. The metal material M is a paste prepared by mixing the metal particles and a solvent such as alcohol.

The substrate B is for example a lead frame.

The components C are for example semiconductor chips. The components C may for example be wires.

The frame 10 supports the wall section 20. The frame 10 is for example made from stainless steel. A support base 14 (FIG. 3) is attached to the frame 10.

As illustrated in FIG. 3, the support base 14 is to support the substrate B. The support base 14 is for example made from copper.

Referring again to FIG. 1, the wall section 20 extends in a vertical direction. The wall section 20 is for example made from stainless steel.

The rotational shaft 30 is fixed to the wall section 20. The rotational shaft 30 extends in a longitudinal direction. The rotational shaft 30 is for example made from stainless steel.

Each of the pressing sections 40 has an arm 42, a presser 43, and a weight 45.

The arms 42 extend from the rotational shaft 30. The arms 42 are for example made from stainless steel. The arms 42 pivot about the rotational shaft 30.

The pressers 43 for example have a spherical shape. The pressers 43 for example have a diameter of 5 mm. The pressers 43 are attached to the respective arms 42. Specifically, half of each presser 43 is embedded in the corresponding arm 42, and the other half thereof is exposed from the arm 42. The pressers 43 press the components C. Each presser 43 has a pressing surface 44. Preferably, each of the pressing surfaces 44 is downwardly convex. More preferably, each of the pressing surfaces 44 is a portion of a spherical surface.

The components C are bonded to the substrate B through point contact of the pressers 43 with the respective components C. Preferably, the components C are bonded to the substrate B through point contact of each presser 43 with a central region of the corresponding component C. As a result of each presser 43 coming in point contact with the central region of the corresponding component C, it is possible to prevent the components C from tilting, and thus apply uniform pressure to the entire area of each component C during bonding. The pressers 43 are elastic bodies. The pressers 43 are for example made from TEFLON (registered Japanese trademark). Since the pressers 43 are elastic bodies, it is possible to prevent the pressers 43 from damaging the components C when the pressers 43 press the components C.

The weights 45 are attached to the respective arms 42. The weights 45 are for example made from copper. The weights 45 for example have a rectangular prism shape. Each of the weights 45 has a through hole 451 and a screw hole 452. A diameter of the through holes 451 is substantially the same as a diameter of the arms 42. Each of the weights 45 is attached to a specific location in the corresponding arm 42 through the arm 42 being inserted into the through hole 451 and a screw 453 being inserted into the screw hole 452. The weights 45 have a size determined so as to prevent the pressers 43 from making contact with another element (for example, the frame 10) when the pressers 43 are in point contact with the respective components C. Since only the pressers 43 come in point contact with the components C, it is possible to effectively apply pressure to the components C. The pressers 43 are located between the rotational shaft 30 and the weights 45. In the bonding device 100, the principle of leverage works using the rotational shaft 30 as point of fulcrum, the weights 45 as point of effort, and the pressers 43 as point of load. Thus, the bonding device 100 can achieve high pressure while saving space. Furthermore, it is possible to readily adjust the load on the pressers 43 by adjusting a distance between the pressers 43 and the weights 45. It is also possible to readily adjust the load on the pressers 43 by replacing the weights 45 with weights 45 having a different weight. Addition of a mechanism for changing positions of the pressers 43 further makes it possible to adjust the load on the pressers 43 by changing a distance between the pressers 43 and the rotational shaft 30.

The following describes a bonding method that is implemented by the bonding device 100 with reference to FIGS. 2A to 2D. The substrate B and the components C are bonded together using the metal material M through processes illustrated in FIGS. 2A to 2D.

The bonding device 100 is prepared as illustrated in FIG. 2A. The pressing surfaces 44 are oriented upward when the bonding device 100 is in a state illustrated in FIG. 2A.

The substrate B is placed on an upper surface of the support base 14 (FIG. 3) as illustrated in FIG. 2B. Subsequently, the metal material M is applied onto an upper surface of the substrate B. Subsequently, the components C are placed on the metal material M. That is, a layer of the components C is formed on the substrate B with the metal material M therebetween.

The arms 42 are pivoted clockwise as illustrated in FIG. 2C.

The arms 42 are pivoted clockwise until the pressers 43 come in point contact with the respective components C as illustrated in FIG. 2D. The bonding device 100 bonds the components C to the substrate B through point contact of the pressers 43 with the respective components C. Typically, in order to bond the components C to the substrate B using the metal material M, the bonding device 100 is placed in a heating oven and the metal material M is sintered to bond the components C to the substrate B.

According to a generic device, pressure is applied to the components C by placing a component pressing plate such as a glass board on the components C and stacking up weights on the component pressing plate. Such a device therefore needs more weights to be stacked high in order to increase the pressure. By contrast, the bonding device 100 uses the principle of leverage, and thus the bonding device 100 can have a lower height. Accordingly, the heating oven that receives the bonding device 100 can have a lower height. As a result, it is possible to efficiently heat and sinter the metal material M.

The support base 14 has a higher thermal conductivity than the arms 42. Accordingly, during the sintering of the metal material M, the support base 14 easily conducts heat from below to the substrate B and the components C, and the arms 42 prevent the heat from easily escaping upward from the substrate B and the components C. As a result, it is possible to efficiently heat the metal material M.

An extending direction of the arms 42 is parallel to a horizontal direction when the pressers 43 are in point contact with the respective components C. Accordingly, the bonding device 100 can have a lower height. As a result, the heating oven that receives the bonding device 100 can have a lower height. It is therefore possible to efficiently heat and sinter the metal material M.

Figure 4:
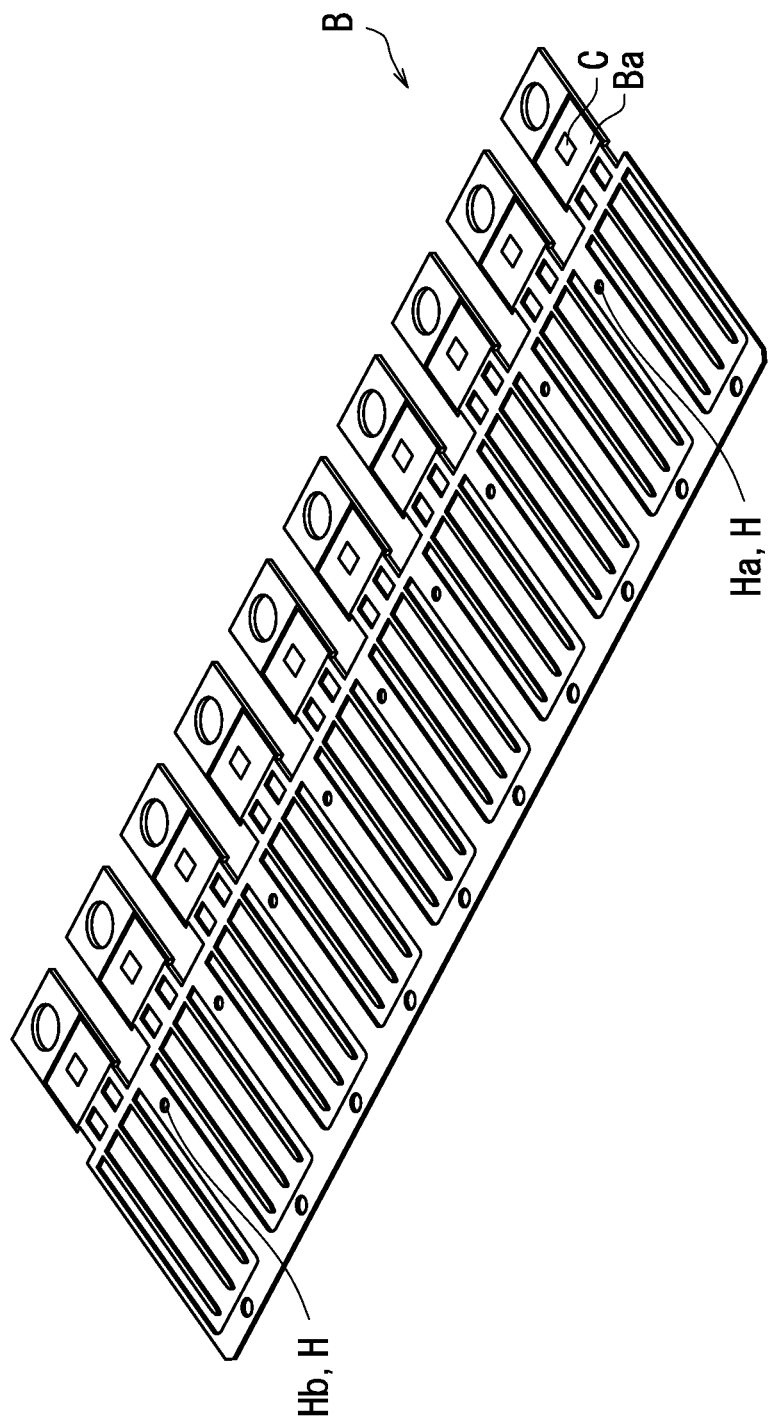
FIG. 4 is a perspective view illustrating a substrate and components.
Figure 5A:
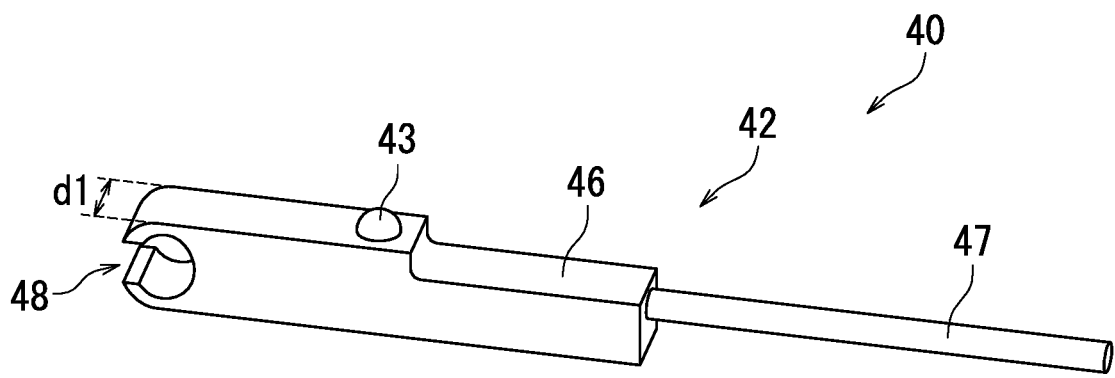
FIG. 5A is a perspective view of a pressing section according to the embodiment of the present invention.
Figure 5B:
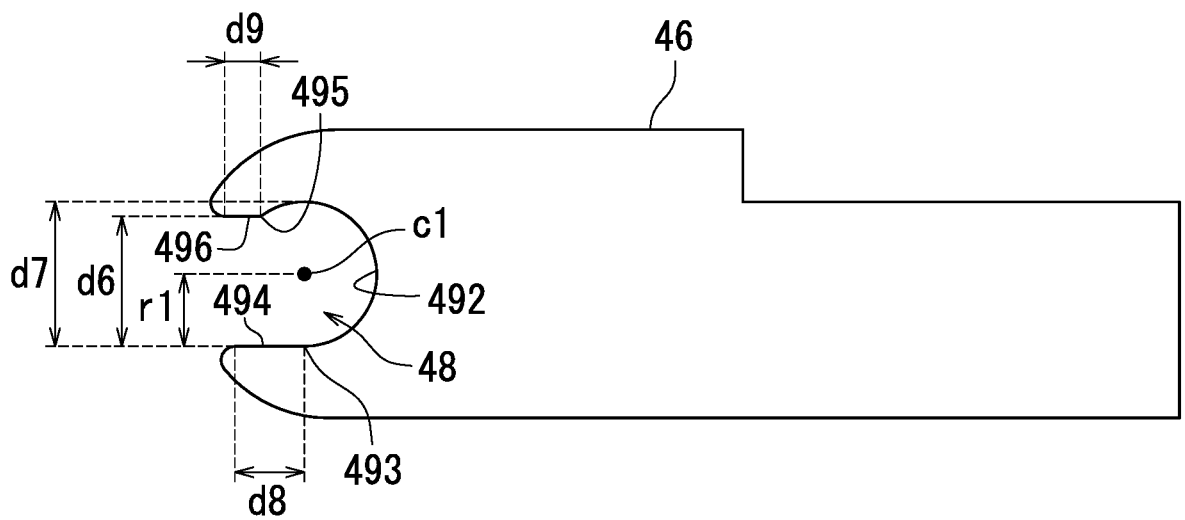
FIG. 5B is a side view illustrating a rotational shaft holding section.
Figure 6A:
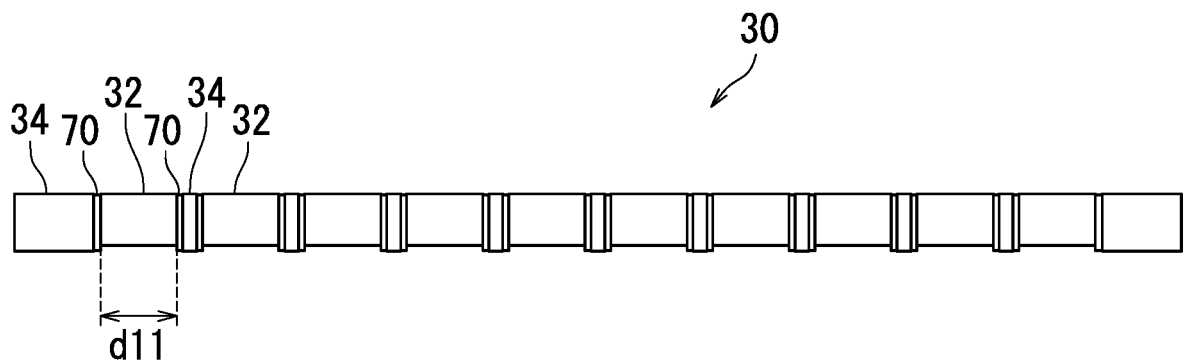
FIG. 6A is a side view illustrating a rotational shaft.
Figure 6B:
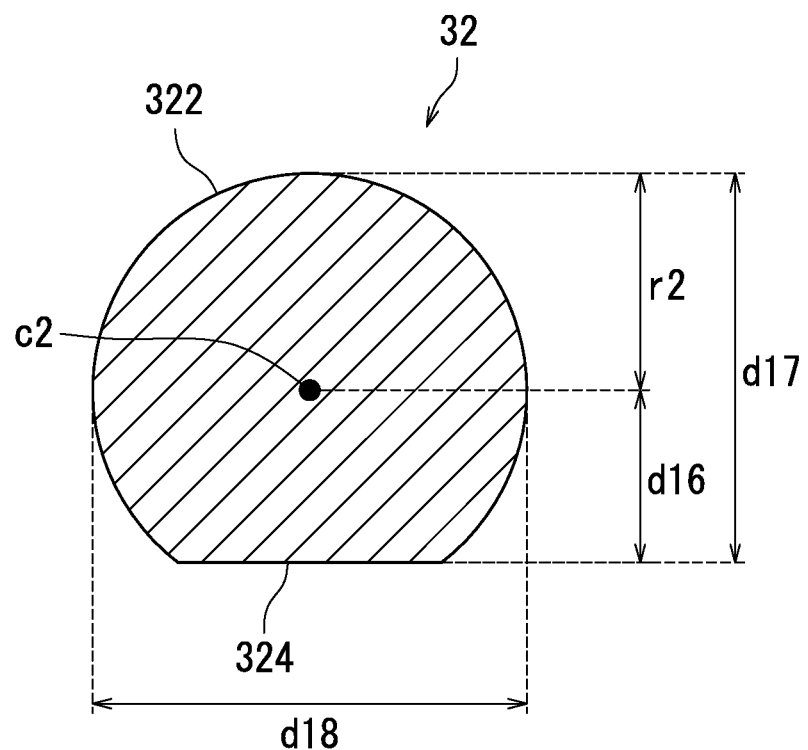
FIG. 6B is a cross-sectional view illustrating an arm attachment section.
Figure 7:
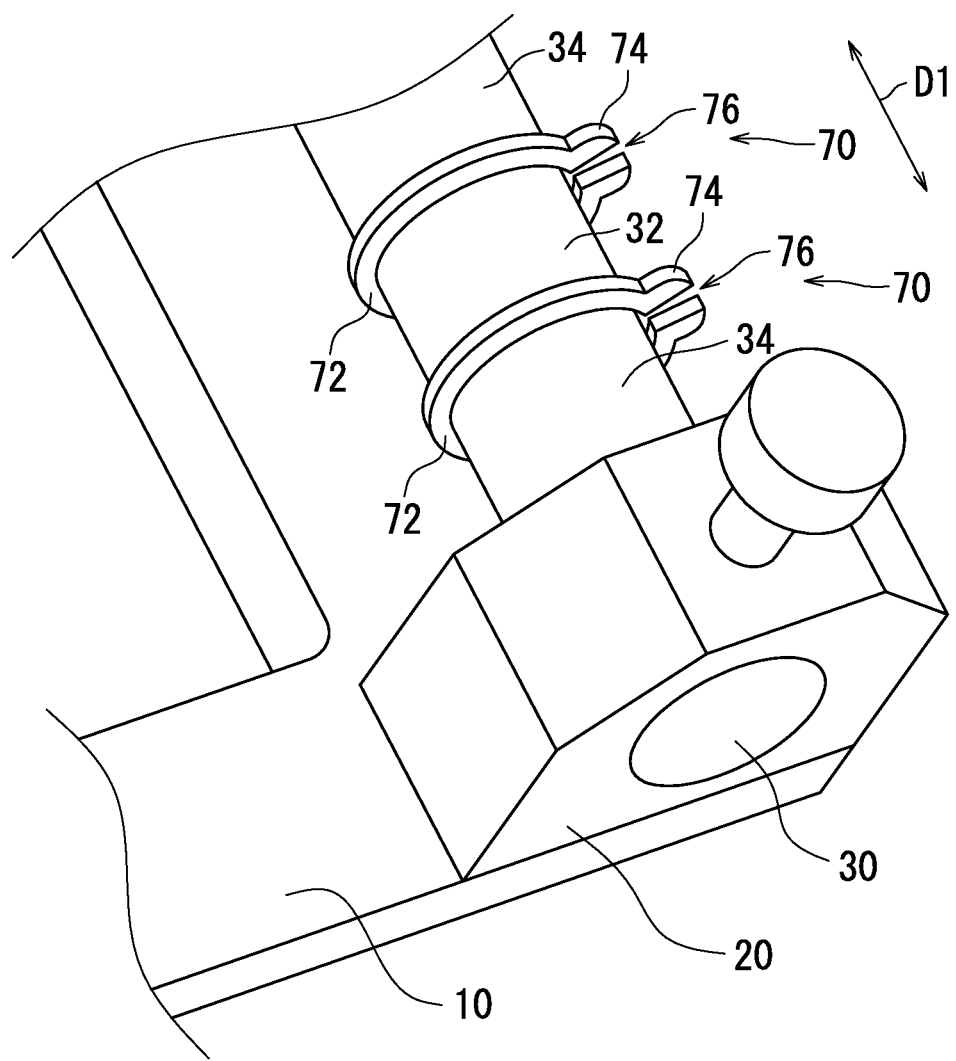
FIG. 7 is a perspective view illustrating a portion of the rotational shaft in the vicinity of a wall section.
Figure 8A:
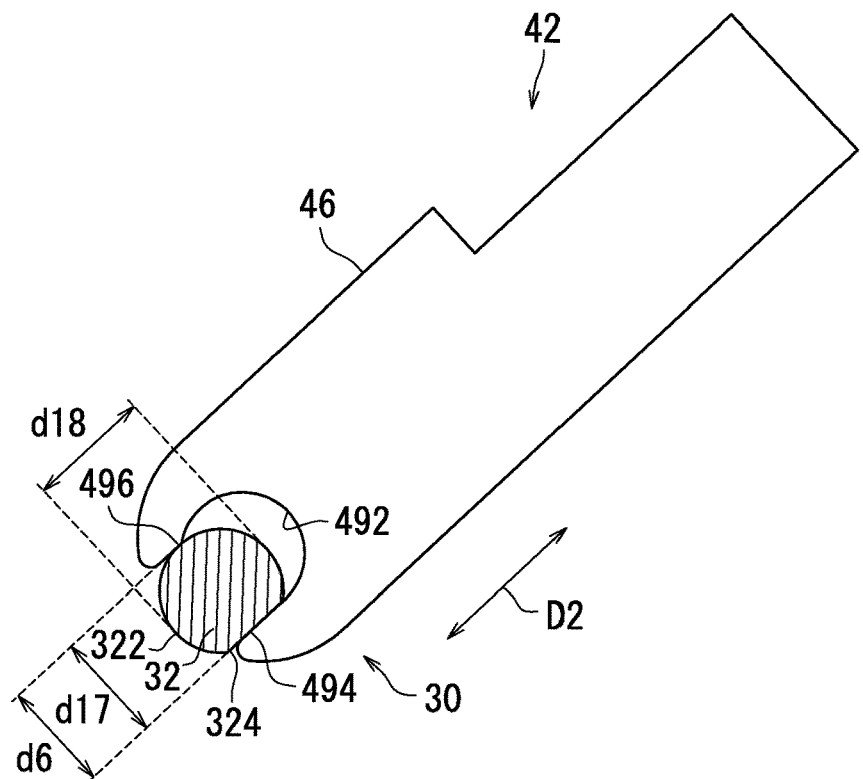
FIGS. 8A and 8B are cross-sectional views illustrating the arm attachment section and the rotational shaft holding section.
Figure 8B:
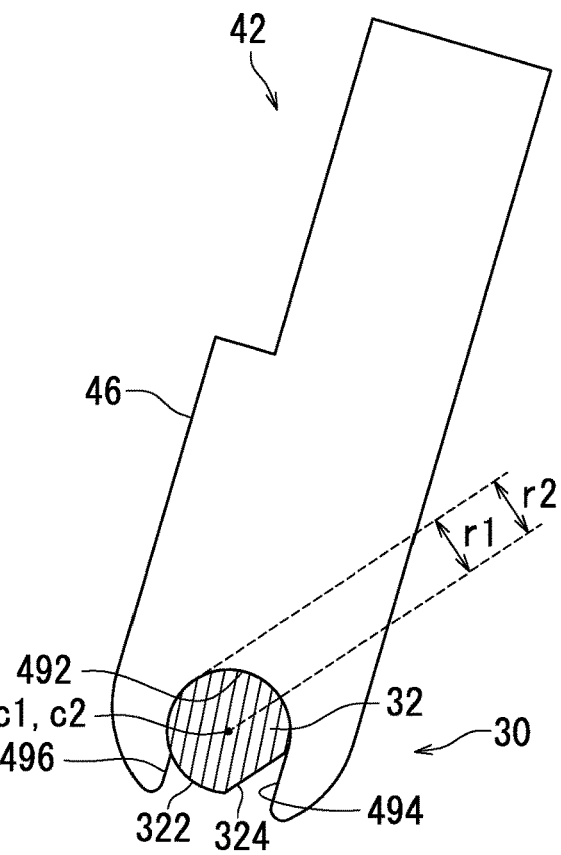

The following further describes the bonding device 100 according to the embodiment of the present invention with reference to FIGS. 3 to 8B. FIG. 4 is a perspective view illustrating the substrate B and the components C. FIG. 5A is a perspective view of one of the pressing sections 40 according to the embodiment of the present invention. FIG. 5B is a side view illustrating a rotational shaft holding section 46. FIG. 6A is a side view illustrating the rotational shaft 30. FIG. 6B is a cross-sectional view illustrating an arm attachment section 32. FIG. 7 is a perspective view illustrating a portion of the rotational shaft 30 in the vicinity of the wall section 20. FIGS. 8A and 8B are cross-sectional views illustrating the arm attachment section 32 and the rotational shaft holding section 46.

As illustrated in FIG. 3, the bonding device 100 includes ten pressing sections 40. Each of the ten pressing sections 40 presses a corresponding one of the components C. Thus, the bonding device 100 can apply pressure to each of the components C separately. As such, the bonding device 100 can set a separate pressure for each of the components C.

As illustrated in FIG. 3, each of the arms 42 has the rotational shaft holding section 46 and a weight attachment section 47. The rotational shaft holding section 46 holds the rotational shaft 30. Each of the weights 45 is attached to the corresponding weight attachment section 47.

The support base 14 is a plate-shaped member. The support base 14 has a rectangular shape. The support base 14 is attachable to and detachable from the frame 10. The support base 14 has a pair of positioning pins 16. The pair of positioning pins 16 can fix a position of the substrate B placed on the support base 14.

The following describes the substrate B and the components C to be placed in the bonding device 100 with reference to FIG. 4. The substrate B includes unit substrates Ba arranged in parallel into the shape of a strip. The substrate B according to the present embodiment has ten unit substrates Ba. Each of the unit substrates Ba receives placement of one component C. The substrate B has a plurality of guide holes H. The number of guide holes H is not limited as long as the substrate B has at least one pair of guide holes H. According to the present embodiment, the positioning pins 16 (FIG. 3) are respectively inserted into guide holes Ha and Hb in a pair, so that the substrate B is fixed to a specific position.

Attempting to bond the components C to the substrate B illustrated in FIG. 4, a conventional bonding method results in deformation (warp) of the substrate B or deformation of a component presser or weights, causing variation in applied pressure among the components C. By contrast, the bonding device 100 includes the pressing sections 40. The bonding device 100 can apply pressure to each of the components C separately. It is therefore possible to prevent variation in applied pressure among the components C.

The following further describes the pressing sections 40 with reference to FIG. 5A. In FIG. 5A, a thickness d1 indicates a thickness of the rotational shaft holding section 46. As illustrated in FIG. 5A, each pressing section 40 has the arm 42 and the presser 43. The arm 42 has the rotational shaft holding section 46 and the weight attachment section 47.

The rotational shaft holding section 46 is plate-shaped. The thickness d1 of the rotational shaft holding section 46 is for example 6 mm. One end of the rotational shaft holding section 46 is connected with the weight attachment section 47. The other end of the rotational shaft holding section 46 has a C-shaped cutout 48. The presser 43 is attached to the rotational shaft holding section 46.

The weight attachment section 47 is rod-shaped. The weight attachment section 47 is cylindrical. The weight 45 is attached to the weight attachment section 47.

The following further describes the rotational shaft holding section 46 with reference to FIG. 5B. In FIG. 5B, a center c1 indicates a center of a circle defining an arc-shaped section 492. A radius r1 indicates a radius of the circle defining the arc-shaped section 492. A distance d6 indicates a distance between a first flat section 494 and a second flat section 496. A diameter d7 indicates a diameter of the circle defining the arc-shaped section 492. A length d8 indicates a length of the first flat section 494. A length d9 indicates a length of the second flat section 496.

As illustrated in FIG. 5B, the rotational shaft holding section 46 has the arc-shaped section 492, the first flat section 494, and the second flat section 496. The arc-shaped section 492, the first flat section 494, and the second flat section 496 define the cutout 48.

The arc-shaped section 492 has an arc shape. The arc-shaped section 492 is a portion of the circle having the center c1 and the radius r1. The radius r1 is for example 5 mm.

The first flat section 494 is connected with one end 493 of the arc-shaped section 492. The first flat section 494 is flat.

The second flat section 496 is connected with another other end 495 of the arc-shaped section 492. The second flat section 496 is flat.

The distance d6 is shorter than the diameter d7. The distance d6 is for example 9 mm. The diameter d7 is for example 10 mm. According to the present embodiment, the length d8 of the first flat section 494 is longer than the length d9 of the second flat section 496.

The following further describes the rotational shaft 30 with reference to FIGS. 6A and 6B. In FIG. 6A, a distance d11 indicates a distance between a pair of arm movement restriction sections 70. In FIG. 6B, a center c2 indicates a center of a circle defining an arc-shaped section 322. A radius r2 indicates a radius of the circle defining the arc-shaped section 322. A shortest distance d16 indicates a shortest distance from the center c2 to a flat section 324. A length d17 indicates a length obtained as a sum of the radius r2 and the shortest distance d16. A diameter d18 indicates a diameter of the circle defining the arc-shaped section 322.

As illustrated in FIG. 6A, the rotational shaft 30 has a plurality of arm attachment sections 32, a plurality of main body sections 34, and a plurality of arm movement restriction sections 70.

Each of the arm attachment sections 32 has a cylindrical shape having a cutaway portion. The arms 42 are attached to the respective arm attachment sections 32.

Each of the main body sections 34 is cylindrical. The main body sections 34 are connected with the arm attachment sections 32 via the arm movement restriction sections 70.

As illustrated in FIG. 7, each of the arm movement restriction sections 70 has an annular section 72, a protruding section 74, and a cutout 76. The annular section 72 is ring-shaped. The protruding section 74 protrudes from the annular section 72. The annular section 72 has the cutout 76. Each pair of adjacent arm movement restriction sections 70 restricts movement of a corresponding one of the arms 42 in an axial direction D1 of the rotational shaft 30. Each of the arm attachment sections 32 is defined by one of pairs of arm movement restriction sections 70. That is, the pairs of arm movement restriction sections 70 are provided in one-to-one correspondence with the arms 42. The distance d11 (FIG. 6A) between each pair of arm movement restriction sections 70 is substantially equal to the thickness d1 (FIG. 5A) of each rotational shaft holding section 46.

As illustrated in FIG. 6B, a peripheral surface of each arm attachment section 32 has the arc-shaped section 322 and the flat section 324.

The arc-shaped section 322 has an arc shape. The arc-shaped section 322 is a portion of the circle having the center c2 and the radius r2. The radius r2 is for example 5 mm. According to the present embodiment, the radius r2 is equal to the radius r1 (FIG. 5B).

The flat section 324 is connected with the arc-shaped section 322. The flat section 324 is flat.

The length d17 is equal to or shorter than the distance d6 (FIG. 5B). According to the present embodiment, the length d17 is equal to the distance d6. The length d17 is for example 9 mm. The radius r2 is for example 5 mm. The shortest distance d16 is for example 4 mm. The diameter d18 is greater than the distance d6 (FIG. 5B).

Preferably, the arms 42 are attachable to and detachable from the rotational shaft 30. The following describes a configuration in which the arms 42 are attachable and detachable with reference to FIGS. 5A to 6B, 8A, and 8B.

As described with reference to FIGS. 5A to 6B, the diameter d18 is greater than the distance d6. Furthermore, the length d17 is equal to or shorter than the distance d6. According to the present embodiment, the length d17 is substantially equal to the distance d6. Each rotational shaft holding section 46 can therefore be attached to the corresponding arm attachment section 32 when the rotational shaft holding section 46 is angled in a direction D2 where the first flat section 494 and the second flat section 496 of the rotational shaft holding section 46 are parallel to the flat section 324 of the arm attachment section 32 as illustrated in FIG. 8A. Specifically, the rotational shaft holding section 46 angled in the direction D2 allows the arm attachment section 32 to pass between the first flat section 494 and the second flat section 496. Thus, the rotational shaft holding section 46 can be attached to the arm attachment section 32. That is, the arm 42 can be attached to the rotational shaft 30.

The rotational shaft holding section 46 is kept on the arm attachment section 32 through the rotational shaft holding section 46 being pivoted and angled in any direction other than the direction D2 as illustrated in FIG. 8B. Since the diameter d18 is greater than the distance d6, the second flat section 496 gets caught on the arm attachment section 32 to prevent the rotational shaft holding section 46 from coming off the arm attachment section 32. According to the present embodiment, the radius r1 is equal to the radius r2. Accordingly, the rotational shaft holding section 46 can be smoothly pivoted with the arc-shaped section 492 of the rotational shaft holding section 46 sliding along the arc-shaped section 322 of the arm attachment section 32.

The rotational shaft holding section 46 kept on the arm attachment section 32 as illustrated in FIG. 8B becomes able to allow the arm attachment section 32 to pass between the first flat section 494 and the second flat section 496 by being angled in the direction D2 so as to shift to a state illustrated in FIG. 8A. Thus, the rotational shaft holding section 46 can be detached from the arm attachment section 32. That is, the arm 42 can be detached from the rotational shaft 30.

The arms 42 are attachable to and detachable from the rotational shaft 30. It is therefore possible to bond only desired components C by selecting such components and detaching corresponding arms 42 from the rotational shaft 30.

The diameter d18 of the circle defining the arc-shaped section 322 of the arm attachment section 32 is greater than the distance d6 between the first flat section 494 of the rotational shaft holding section 46 and the second flat section 496 of the rotational shaft holding section 46. Furthermore, the length d17 obtained as a sum of the radius r2 of the circle defining the arc-shaped section 322 of the arm attachment section 32 and the shortest distance d16 from the center c2 of the circle defining the arc-shaped section 322 of the arm attachment section 32 to the flat section 324 of the arm attachment section 32 is equal to or shorter than the distance d6 between the first flat section 494 of the rotational shaft holding section 46 and the second flat section 496 of the rotational shaft holding section 46. Accordingly, the rotational shaft holding section 46 can be attached to and detached from the arm attachment section 32 only when the rotational shaft holding section 46 is at a specific angle. The rotational shaft holding section 46 is kept on the arm attachment section 32 when the rotational shaft holding section 46 is at any angle other than the specific angle.

As described with reference to FIGS. 1 to 8B, the bonding device 100 bonds the components C to the substrate B using the metal material M through point contact of the pressers 43 with the respective components C. It is therefore possible to apply uniform pressure to the entire area of each component C. This results in highly reproducible bonding with less shear strength variation among the components C on the substrate B.

As described with reference to FIGS. 1 to 8B, each of the pressing surfaces 44 in the bonding device 100 is downwardly convex. Accordingly, the pressers 43 can come in point contact with the respective components C. As a result, it is possible to apply uniform pressure to the entire area of each component C.

As described with reference to FIGS. 1 to 8B, the bonding device 100 bonds the components C to the substrate B through point contact of each presser 43 with the central region of the corresponding component C. It is therefore possible to apply uniform pressure to the entire area of each component C.

The bonding device 100 includes at least one pressing section 40, and each pressing section 40 has the arm 42 and the weight 45 attached to the arm 42 as described with reference to FIGS. 1 to 8B. Each pressing section 40 also has the presser 43 located between the rotational shaft 30 and the weight 45. In the bonding device 100, therefore, the principle of leverage works using the rotational shaft 30 as point of fulcrum, the weight 45 as point of effort, and the presser 43 as point of load. Thus, the bonding device 100 can achieve high pressure while saving space. Furthermore, it is possible to readily adjust the load on the presser 43 by adjusting the distance between the presser 43 and the weight 45. It is also possible to readily adjust the load on the presser 43 by replacing the weight 45 with a weight 45 having a different weight. Addition of a mechanism for changing the position of the presser 43 further makes it possible to adjust the load on the presser 43 by changing the distance between the presser 43 and the rotational shaft 30.

In the bonding device 100, as described with reference to FIGS. 1 to 8B, the arms 42 are attachable to and detachable from the rotational shaft 30. It is therefore possible to bond only desired components C by selecting such components and detaching corresponding arms 42 from the rotational shaft 30.

As described with reference to FIGS. 1 to 8B, the bonding device 100 includes the support base 14 that supports the substrate B. The support base 14 also fixes the position of the substrate B. Thus, the position of the substrate B can be fixed so that each of the pressers 43 comes in point contact with the central region of the corresponding component C. It is therefore possible to apply uniform pressure to the entire area of each component C.

In the bonding device 100, as described with reference to FIGS. 1 to 8B, the support base 14 has a higher thermal conductivity than the arms 42. Accordingly, during the sintering of the metal material M, the support base 14 easily conducts heat from below to the substrate B and the components C, and the arms 42 prevent the heat from easily escaping upward from the substrate B and the components C. As a result, it is possible to efficiently heat the metal material M. In a configuration in which the pressers 43 are made from a heat-resistant and low-thermal-conductive fluororesin, the pressers 43 also prevents the heat from easily escaping even when the pressers 43 are in direct contact with the respective components C, enabling more efficient heating.

In the bonding device 100, as described with reference to FIGS. 1 to 8B, the extending direction of the arms 42 is parallel to the horizontal direction when the pressers 43 are in point contact with the respective components C. Accordingly, the bonding device 100 can have a lower height. As a result, the heating oven that receives the bonding device 100 can have a lower height. It is therefore possible to efficiently heat and sinter the metal material M.

In the bonding device 100, as described with reference to FIGS. 1 to 8B, the pressers 43 are elastic bodies. It is therefore possible to prevent the pressers 43 from damaging the components C when the pressers 43 press the components C.

As described with reference to FIGS. 1 to 8B, the bonding device 100 includes a plurality of pressing sections 40. Each of the pressing sections 40 presses a corresponding one of the components C. Thus, the bonding device 100 can apply pressure to each of the components C separately. As such, the bonding device 100 can set a separate pressure for each of the components C.

Figure 9A:
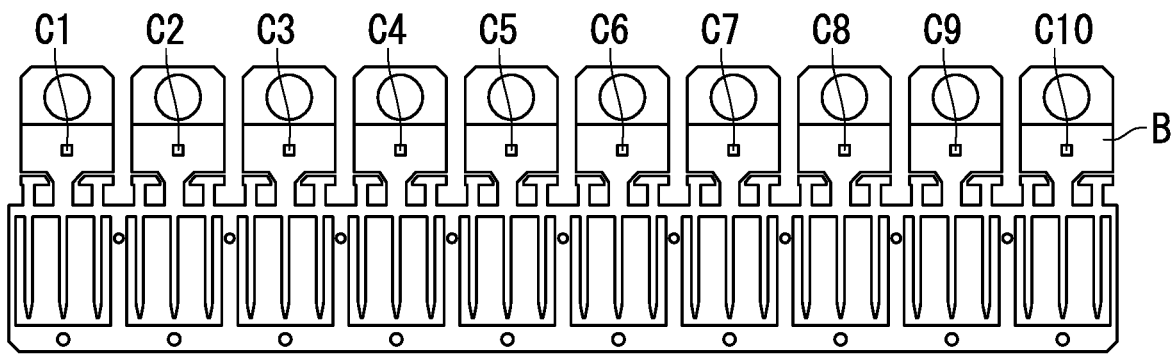
FIG. 9A is a diagram illustrating the substrate and the components bonded together by the bonding device according to the embodiment of the present invention.
Figure 9B:
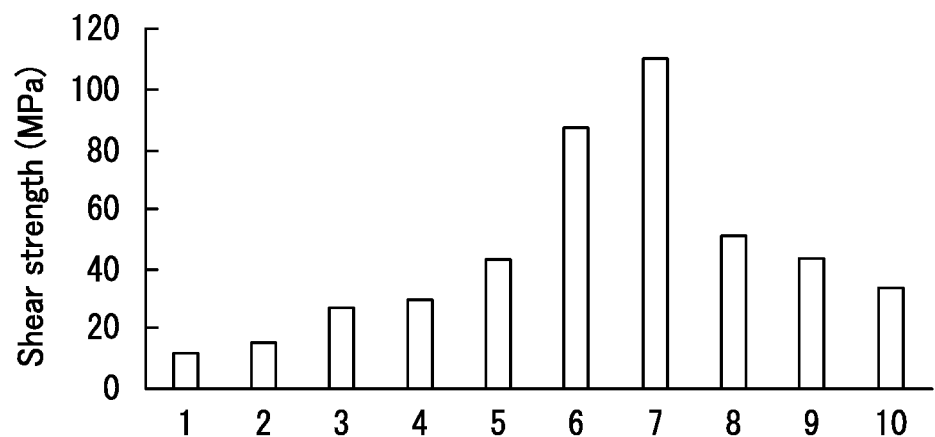
FIG. 9B is a graph illustrating a result of shear strength of the substrate and the components bonded together by a conventional method.
Figure 9C:
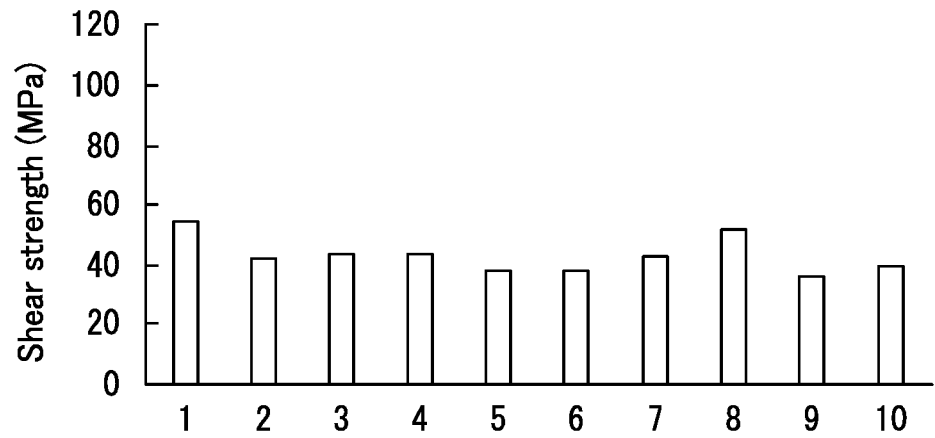
FIG. 9C is a graph illustrating a result of shear strength of the components bonded by the bonding device according to the embodiment of the present invention.

The following describes an example of the bonding device 100 according to the embodiment of the present invention with reference to FIGS. 9A to 9C. FIG. 9A is a diagram illustrating the substrate B and the components C bonded together by the bonding device 100 according to the embodiment of the present invention. FIG. 9B is a graph illustrating a result of shear strength of the substrate B and the components C bonded together by a conventional method. FIG. 9C is a graph illustrating a result of shear strength of the components C bonded by the bonding device 100 according to the embodiment of the present invention. In each of FIGS. 9B and 9C, the horizontal axis represents number of the components C, and the vertical axis represents shear strength.

The bonding device 100 illustrated in FIG. 3 in which the weight of the weights 45 had been adjusted was used. Ten 1.85 mm×1.85 mm square SiC Schottky barrier diodes (components C) were bonded to a TO247 lead frame (substrate B) as illustrated in FIG. 9A. The bonding device 100 was placed in a vacuum oven (RSS-450-210), product of UniTemp. A chip-to-chip pitch was 17.5 mm, and ten arms 42 were arranged according to the pitch. A silver paste was used as a die attach material (metal material M). The weights 45 were fixed to the respective arms 42 so as to apply a load of 140 g (0.4 MPa) to a center of each chip during sintering. The TO247 frame was positioned and fixed by inserting thereto two positioning pins 16 provided on the support base 14.

As indicated in FIG. 9B, the conventional bonding method resulted in shear strength variation among the components C. This is thought to be because the conventional bonding method is not capable of applying uniform pressure to each component due to pressurization through face contact of one component pressing plate with the components C.

By contrast, as indicated in FIG. 9C, bonding of the components C by the bonding device 100 according to the embodiment of the present invention resulted in a shear strength variation of ⅕. This is thought to be because the bonding device 100 is capable of applying uniform pressure to each component C through point contact and component-by-component pressurization. Cross-section observation was performed to confirm that the sintered die attach material had a uniform thickness. The observation result proved that the load applied during the pressurization was uniform.

Figure 10:
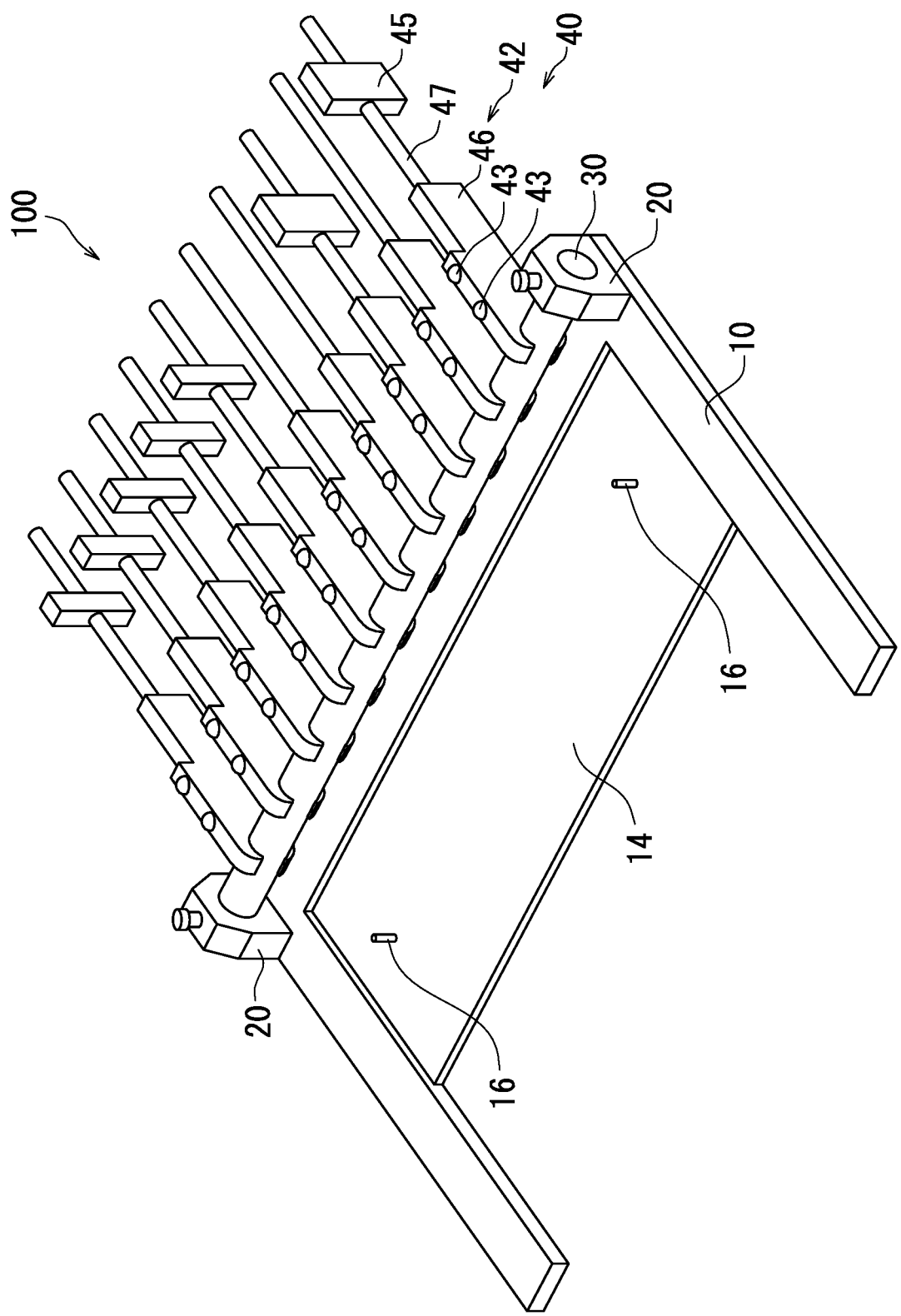
FIG. 10 is a perspective view of a bonding device according to another embodiment of the present invention.
Figure 11:
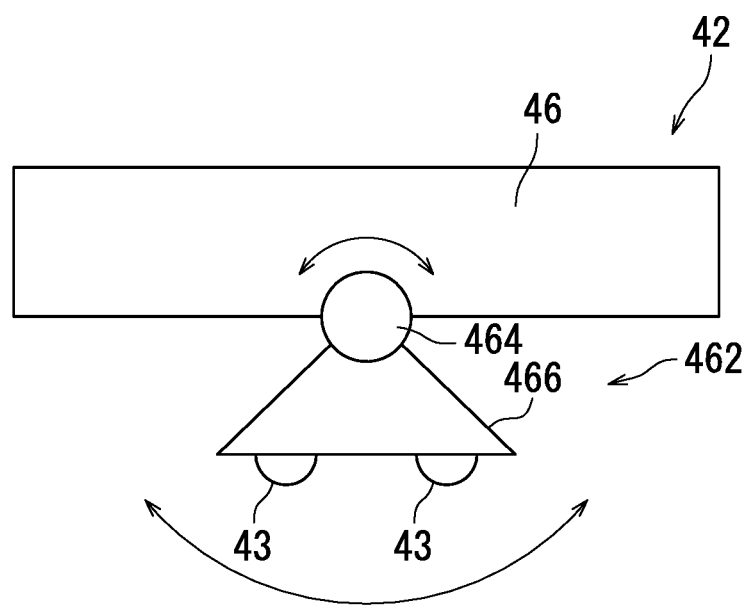
FIG. 11 is a schematic side view of an arm.

The arms 42 described with reference to FIGS. 1 to 9C each have one presser 43. However, the present invention is not limited as such. Each arm 42 may have a plurality of pressers 43. FIG. 10 is a perspective view of the bonding device 100 according to another embodiment of the present invention. Each arm 42 has two pressers 43. The two pressers 43 respectively come in point contact with different components C. It is therefore possible to apply pressure to components C in various arrangements on the substrate B. In a configuration in which each arm 42 has a plurality of pressers 43, it is preferable that the pressers 43 are flexibly movable. FIG. 11 is a schematic side view of such an arm 42. As illustrated in FIG. 11, the arm 42 further has a presser holding section 462. The presser holding section 462 has a movable section 464 and a presser attachment section 466. The movable section 464 is attached to the rotational shaft holding section 46. The movable section 464 is movable from front to back and from side to side about a fixed point on the rotational shaft holding section 46. The presser attachment section 466 is attached to the movable section 464. The two pressers 43 are attached to the presser attachment section 466. The presser attachment section 466 moves with movement of the movable section 464. It is therefore possible to apply uniform pressure to a plurality of components C through a plurality of pressers 43 provided on one arm 42. Note that in the configuration in which each arm 42 has a plurality of pressers 43 for respectively applying pressure to a plurality of components C, the number of pressers 43 is preferably no greater than three in terms of applying uniform pressure to the plurality of components C. In a configuration in which each arm 42 has three pressers 43 to apply pressure to one large-are component C, the three pressers 43 are preferably disposed on respective vertices of an equilateral triangle.

Figure 12:
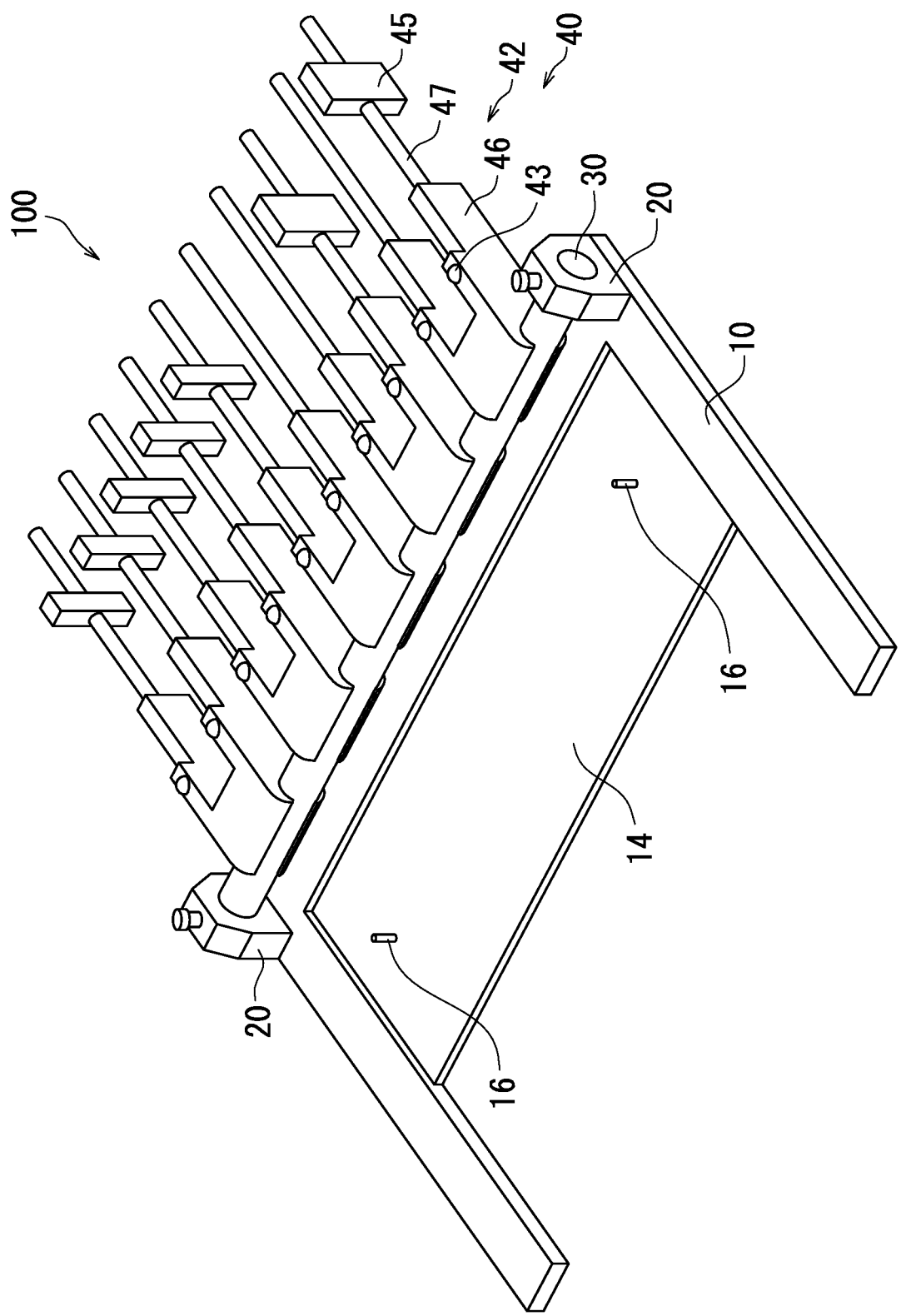
FIG. 12 is a perspective view of the bonding device according to another embodiment of the present invention.

The pressing sections 40 described with reference to FIGS. 1 to 9C each have one arm 42 or one arm 42 and one presser holding section 462. However, the present invention is not limited as such. Each pressing section 40 may have a plurality of arms 42. FIG. 12 is a perspective view of the bonding device 100 according to another embodiment of the present invention. Each pressing section 40 has two arms 42 and two pressers 43. The arms 42 of each pressing section 40 are partially coupled. Thus, the two pressers 43 can be simultaneously brought into point contact with components C by pivoting the arms 42. As in the bonding devices 100 described with reference to FIG. 10, it is preferable that the pressers 43 according to such a configuration are flexibly movable as described with reference to FIG. 11. As a result, it is possible to apply uniform pressure to the components C.

Preferably, positions of the pressers 43 are changed according to positions of the components C placed on the substrate B. The following describes the reason why the positions of the pressers 43 are preferably changed according to the positions of the components C placed on the substrate B with reference to FIGS. 13A to 13D. FIGS. 13A to 13D are schematic side views of one pressing section 40 according to the embodiment of the present invention.

Figure 13A:
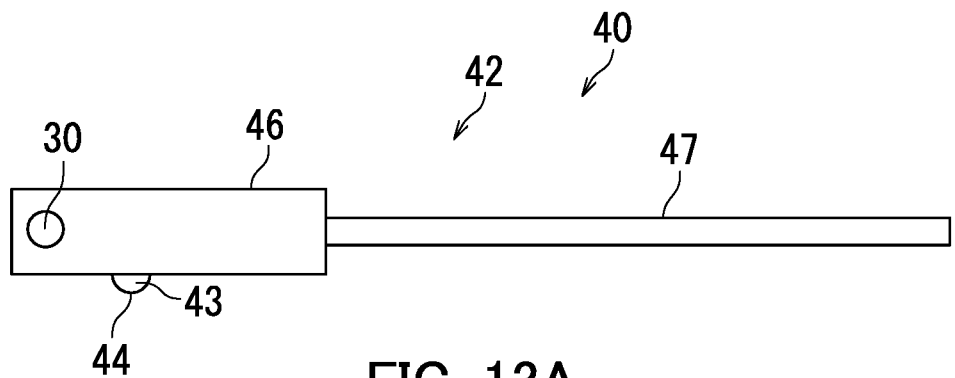
FIGS. 13A to 13D are schematic side views of a pressing section according to the embodiment of the present invention.
Figure 13B:
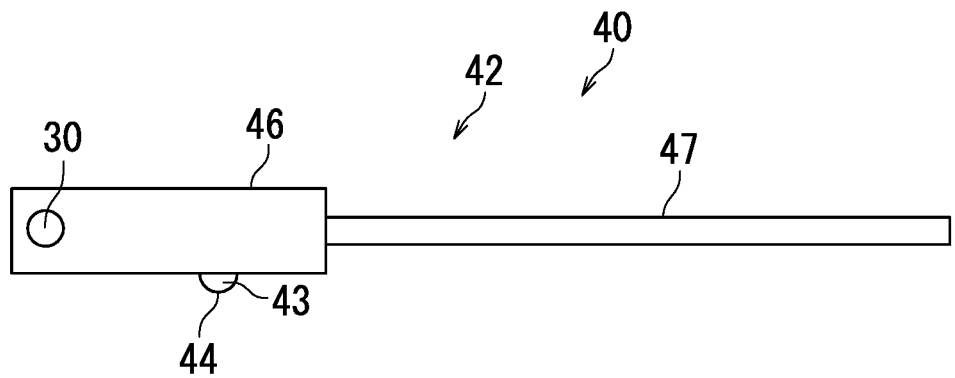

A position of the presser 43 illustrated in FIG. 13B is farther toward one end in the extending direction of the arm 42 (referred to below as an arm direction) than a position of the presser 43 illustrated in FIG. 13A. That is, even in a situation in which positions of the components C on the substrate B are changed in the arm direction, the components C can be bonded to the substrate B by changing the positions of the pressers 43 in the arm direction.

Figure 13C:
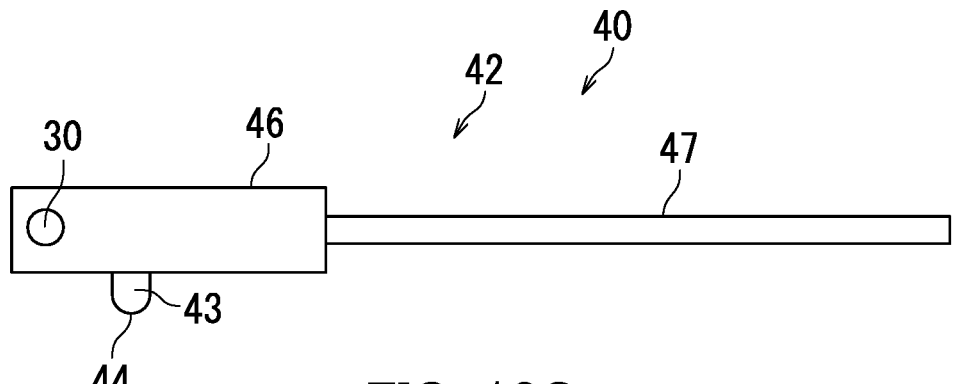

A length of the presser 43 illustrated in FIG. 13C in a height direction is greater than a length of the presser 43 illustrated in FIG. 13A in the height direction. Specifically, the pressing surface 44 of the presser 43 illustrated in FIG. 13C is located below the pressing surface 44 of the presser 43 illustrated in FIG. 13A. That is, even in a situation in which the substrate B having a different thickness is used or the components C having a different thickness are used, the components C can be bonded to the substrate B by changing the length of the pressers 43 in the height direction.

Figure 13D:
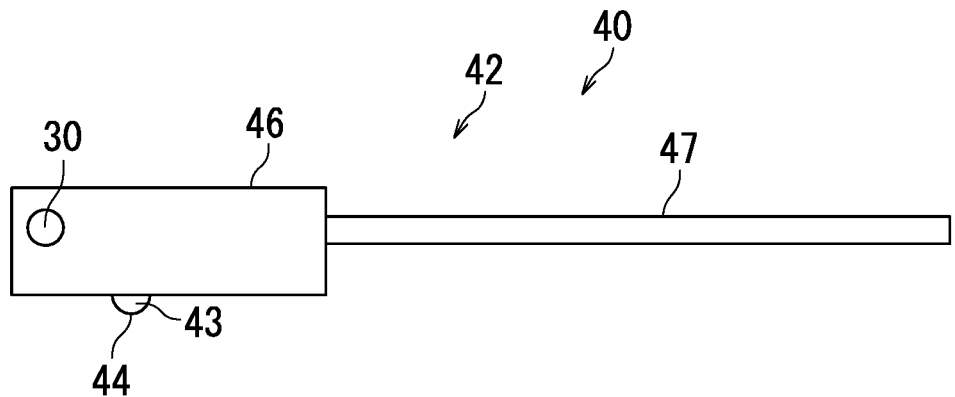

A length of the rotational shaft holding section 46 illustrated in FIG. 13D in the height direction is greater than a length of the rotational shaft holding section 46 illustrated in FIG. 13A in the height direction. That is, even in a situation in which the substrate B having a smaller thickness is used or the components C having a smaller thickness are used, the components C can be bonded to the substrate B by changing the length of the rotational shaft holding sections 46 in the height direction.

Figure 14A:
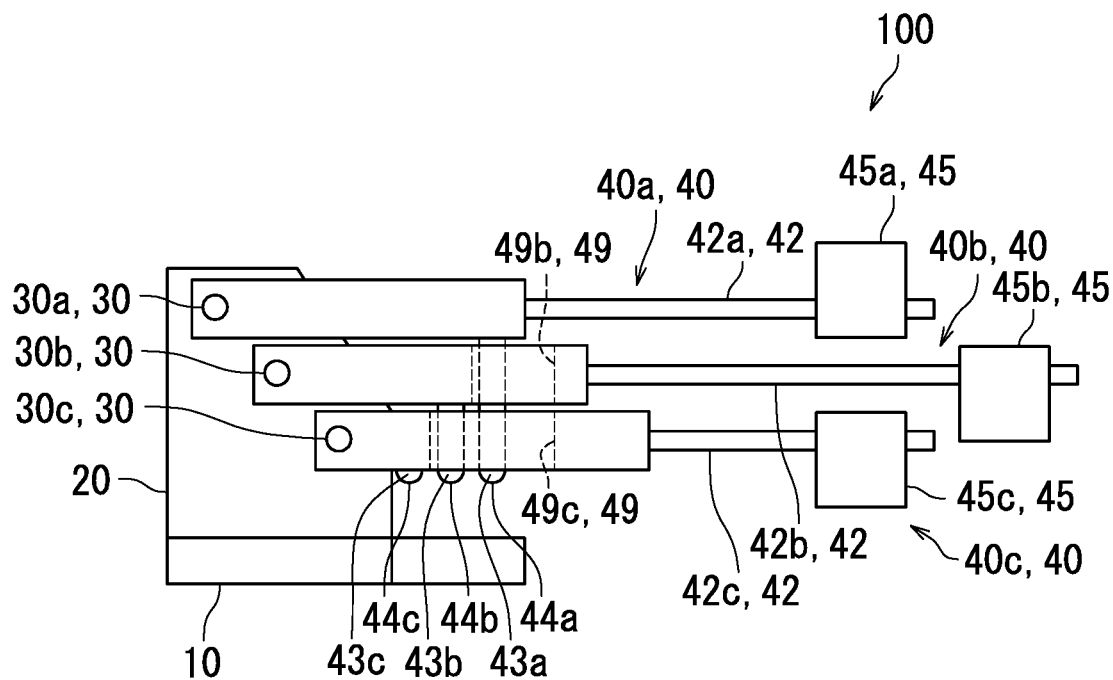
FIG. 14A is a schematic side view of a bonding device according to another embodiment of the present invention.
Figure 14B:
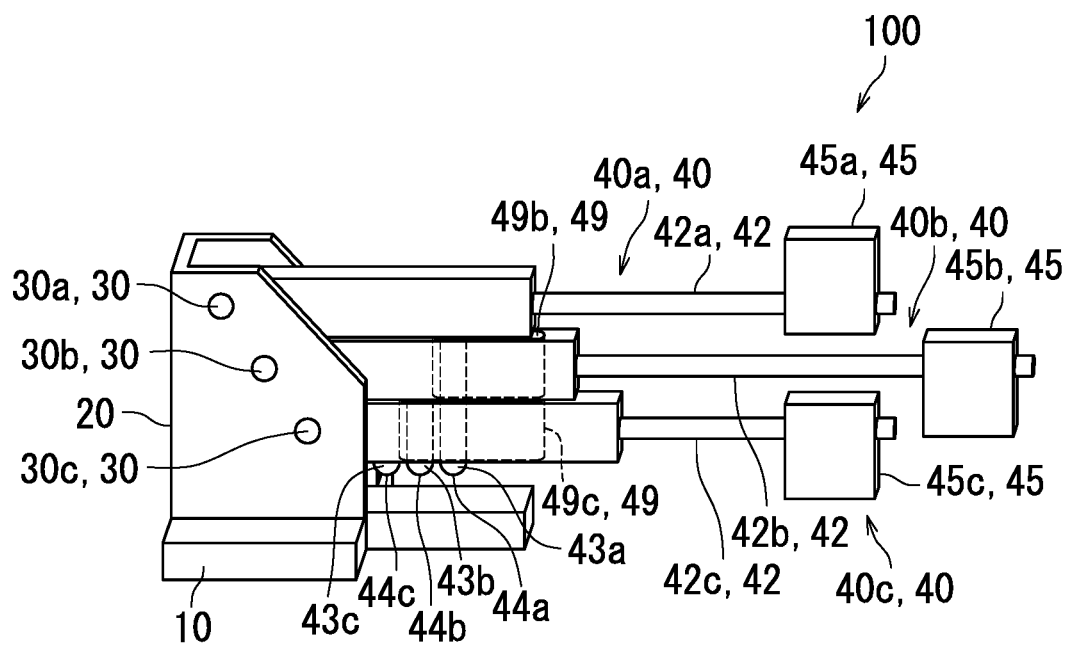
FIG. 14B is a schematic perspective view of the bonding device according to the embodiment of the present invention.

Preferably, the bonding device 100 is capable of bonding a plurality of components C aligned in the arm direction to the substrate B. The following describes the bonding device 100 according to another embodiment of the present invention with reference to FIGS. 14A and 14B. FIG. 14A is a schematic side view of the bonding device 100 according to the embodiment of the present invention. FIG. 14B is a schematic perspective view of the bonding device 100 according to the embodiment of the present invention. Description is omitted for elements of the bonding device 100 illustrated in FIGS. 14A and 14B that are the same as those of the bonding devices 100 described with reference to FIGS. 1 to 13D.

The bonding device 100 illustrated in FIGS. 14A and 14B includes the frame 10, the wall section 20, a first rotational shaft 30a, a second rotational shaft 30b, a third rotational shaft 30c, a first pressing section 40a, a second pressing section 40b, and a third pressing section 40c. The frame 10 supports the wall section 20. The wall section 20 extends in the vertical direction.

The first rotational shaft 30a, the second rotational shaft 30b, and the third rotational shaft 30c are fixed to the wall section 20. Positions of the first rotational shaft 30a, the second rotational shaft 30b, and the third rotational shaft 30c differ from one another in terms of the height direction. Positions of the first rotational shaft 30a, the second rotational shaft 30b, and the third rotational shaft 30c differ from one another also in terms of the arm direction.

The first pressing section 40a extends from the first rotational shaft 30a. The second pressing section 40b extends from the second rotational shaft 30b. The third pressing section 40c extends from the third rotational shaft 30c.

The first pressing section 40a has a first arm 42a, a first presser 43a, and a weight 45a. The second pressing section 40b has a second arm 42b, a second presser 43b, and a weight 45b. The third pressing section 40c has a third arm 42c, a third presser 43c, and a weight 45c. Lengths of the first presser 43a, the second presser 43b, and the third presser 43c in the height direction differ from one another. Specifically, the first presser 43a is the longest, the second presser 43b is the second longest, and the third presser 43c is the third longest in the height direction. More specifically, the lengths of the first presser 43a, the second presser 43b, and the third presser 43c are determined so that a pressing surface 44a of the first presser 43a, a pressing surface 44b of the second presser 43b, and a pressing surface 44c of the third presser 43c come to the same position in terms of the height direction when the first arm 42a, the second arm 42b, and the third arm 42c are pivoted.

The second arm 42b has an opening 49b. The opening 49b allows the first presser 43a to pass therethrough. The third arm 42c has an opening 49c. The opening 49c allows the first presser 43a and the second presser 43b to pass therethrough. Accordingly, the second arm 42b can be pivoted with the second presser 43b passing through the opening 49c after the third arm 42c has been pivoted. Likewise, the first arm 42a can be pivoted with the first presser 43a passing through the opening 49b and the opening 49c after the second arm 42b has been pivoted. Thus, the pressing surface 44a of the first presser 43a, the pressing surface 44b of the second presser 43b, and the pressing surface 44c of the third presser 43c come to the same position in terms of the height direction as a result of the first arm 42a, the second arm 42b, and the third arm 42c being pivoted. The pressing surface 44a of the first presser 43a, the pressing surface 44b of the second presser 43b, and the pressing surface 44c of the third presser 43c are aligned in the arm direction. It is therefore possible to bond a plurality of components C aligned in the arm direction to the substrate B.

Note that the weight 45a, the weight 45b, and the weight 45c are attached to respective locations that prevent the weight 45a, the weight 45b, and the weight 45c from interfering with one another when the first arm 42a, the second arm 42b, and the third arm 42c are pivoted.

A plurality of first pressing sections 40a, a plurality of second pressing sections 40b, and a plurality of third pressing sections 40c may be provided and aligned in an extending direction of the first rotational shaft 30a, an extending direction of the second rotational shaft 30b, and an extending direction of the third rotational shaft 30c, respectively. Such a configuration enables bonding of components C arranged in a matrix on the substrate B. For example, a configuration having three first pressing sections 40a, three second pressing sections 40b, and three third pressing sections 40c enables bonding of components C arranged on the substrate B in a 3-by-3 matrix (nine components C in total) to the substrate B.

As described above with reference to FIGS. 14A and 14B, the second arm 42b of the second pressing section 40b has the opening 49b that allows the first presser 43a of the first pressing section 40a to pass therethrough. The first presser 43a can therefore pass through the opening 49b when the first arm 42a is pivoted. As a result, the bonding device 100 can bond a plurality of components C aligned in the arm direction to the substrate B.

The bonding devices 100 described with reference to FIGS. 1 to 14B bond the components C to the substrate B by pivoting the arms 42 to bring the pressers 43 attached to the pressing sections 40 into contact with the components C. However, the arms 42 and the pressers 43 may be separate, and the bonding device 100 may bond the components C to the substrate B by pivoting the arms 42 to bring the pressers 43 into contact with the arms 42.

Figure 15:
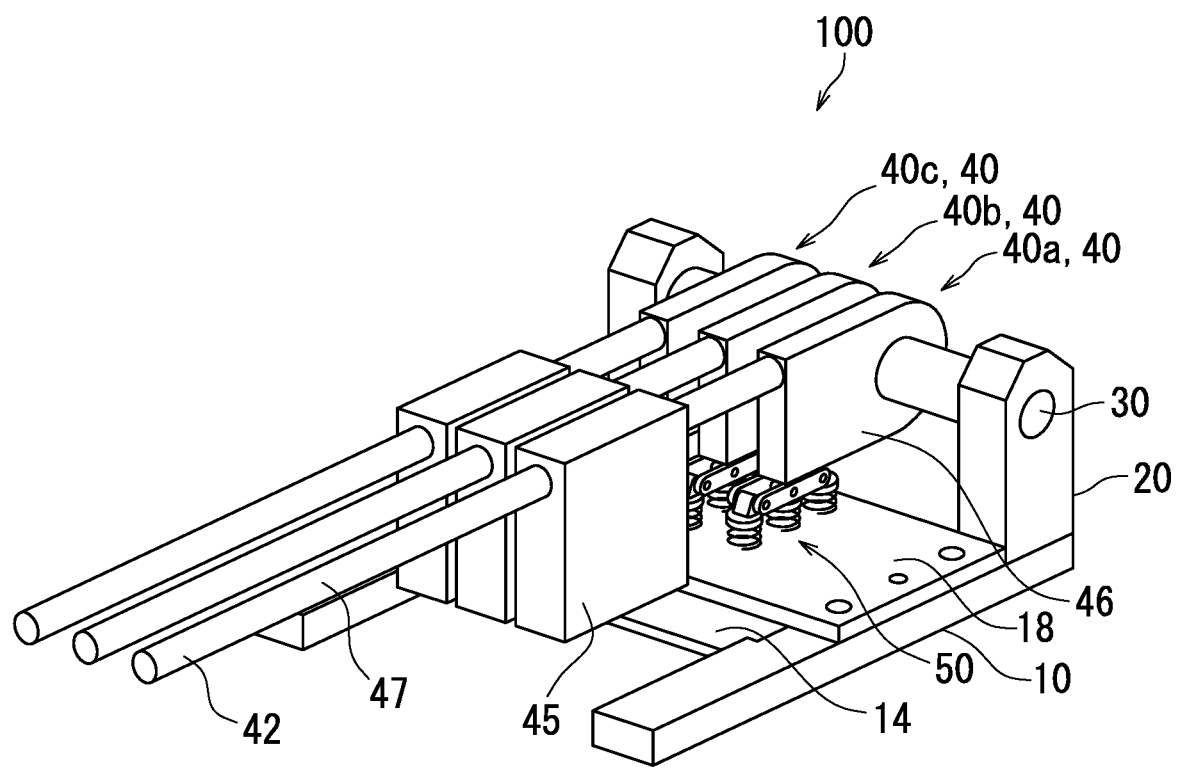
FIG. 15 is a schematic perspective view of a bonding device according to another embodiment of the present invention.
Figure 16A:
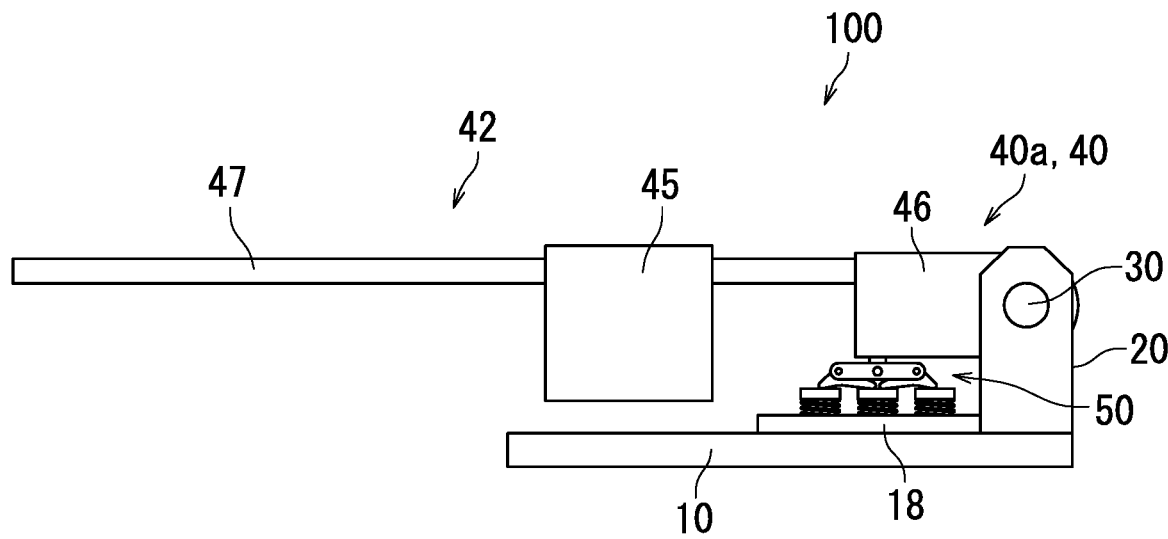
FIG. 16A is a schematic side view of the bonding device according to the embodiment of the present invention.
Figure 16B:
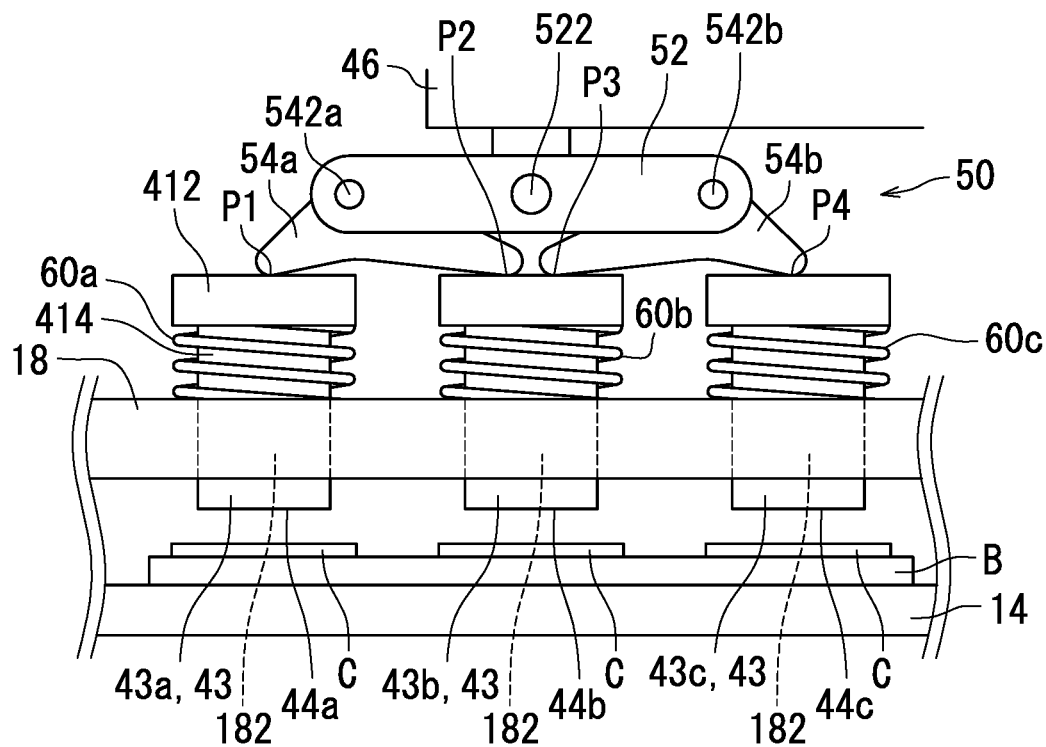
FIG. 16B is a schematic enlarged view of a contact section and elements therearound.

The following describes the bonding device 100 according to another embodiment of the present invention with reference to FIGS. 15 to 16B. FIG. 15 is a schematic perspective view of the bonding device 100 according to the embodiment of the present invention. FIG. 16A is a schematic side view of the bonding device 100 according to the embodiment of the present invention. FIG. 16B is a schematic enlarged view of a contact section 50 and elements therearound. In FIG. 16B, a contact point P1 is a point of contact between a first end movable section 54a and the presser 43a, a contact point P2 is a point of contact between the first end movable section 54a and the presser 43b, a contact point P3 is a point of contact between a second end movable section 54b and the presser 43b, and a contact point P4 is a point of contact between the second end movable section 54b and the presser 43c. Description is omitted for elements of the bonding device 100 illustrated in FIGS. 15 to 16B that are the same as those of the bonding devices 100 described with reference to FIGS. 1 to 14B.

The bonding device 100 illustrated in FIGS. 15 and 16A includes the frame 10, the wall section 20, the rotational shaft 30, the first pressing section 40a, the second pressing section 40b, the third pressing section 40c, the support base 14, and a plate-shaped member 18. Each of the arm 42 of the first pressing section 40a, the arm 42 of the second pressing section 40b, and the arm 42 of the third pressing section 40c has the contact section 50. Each of the first pressing section 40a, the second pressing section 40b, and the third pressing section 40c has three pressers 43. As illustrated in FIG. 16B, the pressers 43 are disposed in the plate-shaped member 18.

As illustrated in FIG. 16B, the contact section 50 includes a connection movable section 52, the first end movable section 54a, and the second end movable section 54b. The connection movable section 52 is attached to the rotational shaft holding section 46. The connection movable section 52 has a shaft 522. The connection movable section 52 is movable about the shaft 522. The first end movable section 54a has a shaft 542a (fixed point). The first end movable section 54a is movable about the shaft 542a. Likewise, the second end movable section 54b has a shaft 542b (fixed point). The second end movable section 54b is movable about the shaft 542b. The contact section 50 comes in contact with the pressers 43. According to the present embodiment, the first end movable section 54a and the second end movable section 54b come in contact with the pressers 43.

The bonding device 100 bonds the components C to the substrate B by bringing the movable sections 54a and 54b into point contact with the pressers 43, and thus bringing the pressers 43 into contact with the components C. Specifically, for bonding the components C to the substrate B, one end of the first end movable section 54a comes in point contact with the presser 43a at the contact point P1. The other end of the first end movable section 54a comes in point contact with the presser 43b at the contact point P2. One end of the second end movable section 54b comes in point contact with the presser 43c at the contact point P4. The other end of the second end movable section 54b comes in point contact with the presser 43b at the contact point P3. Accordingly, uniform load is applied to the pressing surface 44a, the pressing surface 44b, and the pressing surface 44c. As a result, the bonding device 100 can bond a plurality of components C aligned in the arm direction to the substrate B. According to the present embodiment, the three pressing sections 40 are aligned in the axial direction of the rotational shaft 30, and it is therefore possible to bond the components C arranged in a matrix on the substrate B.

Each of the presser 43a, the presser 43b, and the presser 43c has a large-diameter section 412 and a small-diameter section 414. The large-diameter section 412 has a larger diameter than the small-diameter section 414. The large-diameter section 412 and the small-diameter section 414 are for example cylindrical. The small-diameter section 414 has a greater height than the large-diameter section 412. According to the present embodiment, the pressing surfaces 44 are flat. The pressing surfaces 44 may have a shape of a portion of a spherical surface.

The plate-shaped member 18 is attached to the frame 10. The plate-shaped member 18 is located above the support base 14. The plate-shaped member 18 has through holes 182. The through holes 182 have a larger diameter than the small-diameter sections 414. The small-diameter sections 414 can therefore pass through the respective through holes 182. The through holes 182 have a smaller diameter than the large-diameter sections 412.

An elastic member 60a, an elastic member 60b, and an elastic member 60c are for example springs. The elastic member 60a is attached to the presser 43a. The elastic member 60b is attached to the presser 43b. The elastic member 60c is attached to the presser 43c. Specifically, the elastic member 60a surrounds a portion of the small-diameter section 414 with one end thereof attached to the large-diameter section 412. The elastic member 60a, the elastic member 60b, and the elastic member 60c have a larger diameter than the small-diameter sections 414. The elastic member 60a, the elastic member 60b, and the elastic member 60c have a larger diameter than the through holes 182. Accordingly, the elastic member 60a, the elastic member 60b, and the elastic member 60c cannot pass through the respective through holes 182. As such, the elastic members 60 push up the respective pressers 43 when the pressers 43 are out of contact with the contact section 50 as a result of the arms 42 being pivoted, which in other words is when no load is applied from the contact section 50 to the pressers 43. Such a configuration allows the substrate B and the components C to be easily placed on the support base 14.

The bonding device 100 described above with reference to FIGS. 15 to 16B bonds the components C to the substrate B through point contact of the pressers 43 with the movable sections 54a and 54b. It is therefore possible to apply uniform pressure to a plurality of components C using a plurality of pressers 43 provided on one arm 42.

In the bonding device 100 described with reference to FIGS. 15 to 16B, the contact section 50 has a plurality of movable sections (the connection movable section 52, the first end movable section 54a, and the second end movable section 54b). However, the present invention is not limited as such so long as the movable section can be brought into contact with the pressers 43. For example, the contact section 50 may have only one movable section.

Figure 17A:
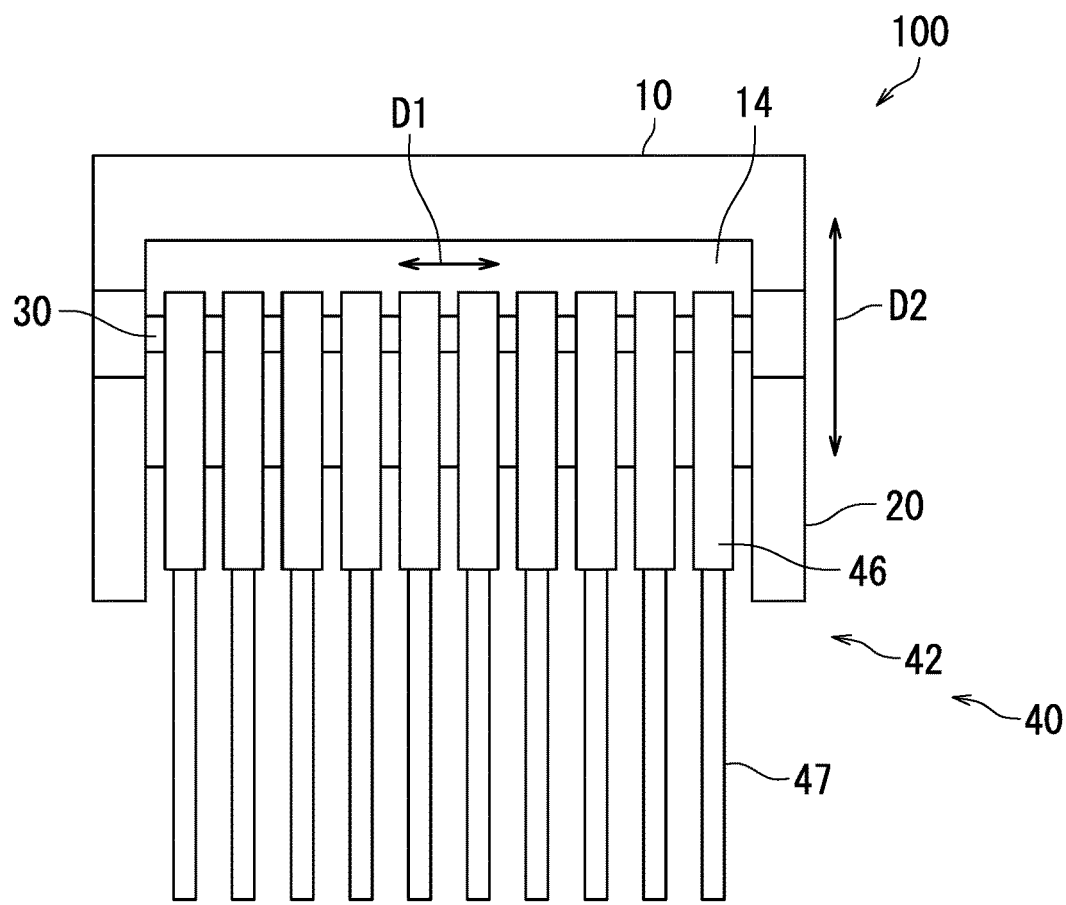
FIG. 17A is a schematic top view of a bonding device according to another embodiment of the present invention.
Figure 17B:
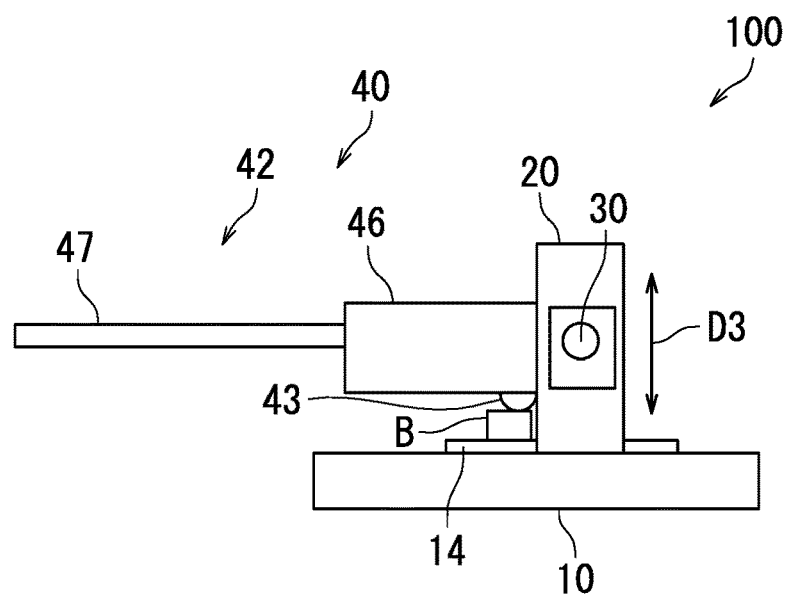
FIG. 17B is a schematic side view of the bonding device according to the embodiment of the present invention.

Preferably, the bonding device 100 has a configuration in which points of pressurization on the components C by the pressing sections 40 are changeable. FIG. 17A is a schematic top view of the bonding device 100 according to another embodiment of the present invention. FIG. 17B is a schematic side view of the bonding device 100 according to the embodiment of the present invention. In FIG. 17A, the axial direction D1 indicates the axial direction of the rotational shaft 30. The direction D2 indicates the arm direction. In FIG. 17B, a direction D3 indicates the vertical direction.

Preferably, the bonding device 100 includes a position adjustment mechanism that enables the pressing sections 40 to move in the axial direction D1 as illustrated in FIG. 17A. Preferably, the bonding device 100 also includes a position adjustment mechanism that enables the pressing sections 40 to move in the direction D2. Such a configuration enables points of pressurization on the components C by the pressing sections 40 to be changeable. As a result, the components C can be placed on the substrate B more flexibly.

Preferably, the bonding device 100 includes a position adjustment mechanism that enables the pressing sections 40 to move in the direction D3 as illustrated in FIG. 17B. Such a configuration enables bonding of the components C to the substrate B without changing the shape of the support base 14 even in a situation in which the substrate B having a different height is used or the components C having a different height are used.

Figure 18:
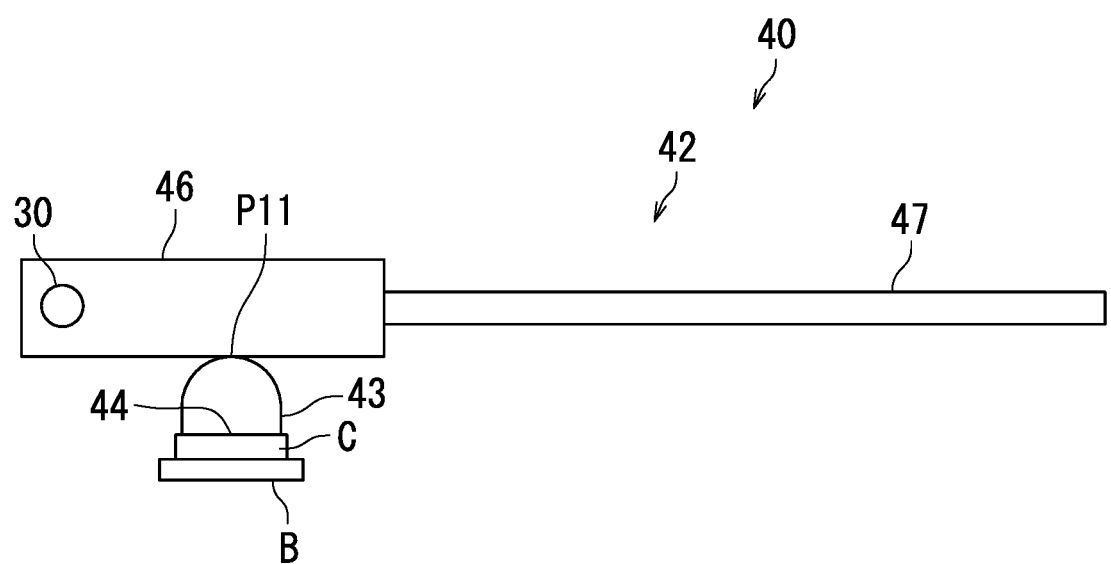
FIG. 18 is a schematic side view of a pressing section according to another embodiment of the present invention.

In the bonding devices 100 described with reference to FIGS. 1 to 17B, the surfaces that come in point contact are downwardly convex. Alternatively, the surfaces that come in point contact may be upwardly convex. FIG. 18 is a schematic side view of one pressing section 40 according to another embodiment of the present invention. In FIG. 18, a contact point P11 is a point of contact between the arm 42 and the presser 43. Description is omitted for elements of the bonding device 100 illustrated in FIG. 18 that are the same as those of the bonding devices 100 described with reference to FIGS. 1 to 17B.

The presser 43 illustrated in FIG. 18 is not attached to the arm 42. That is, the arm 42 and the presser 43 are separable. Preferably, the pressers 43 according to the present embodiment are rigid. According to the present embodiment, the pressing surfaces 44 are flat.

For bonding the components C to the substrate B, first, the pressers 43 are placed above the substrate B. Each of the pressers 43 is brought into point contact with the corresponding arm 42 at the contact point P11 by pivoting the arm 42. According to the present embodiment, the surfaces that come in point contact are upwardly convex. Thus, it is possible to apply uniform pressure to the entire area of each component C using the pressers 43. The pressers 43 according to the present embodiment are rigid. It is therefore possible to bond less rigid components C such as thin-film chips to the substrate B.

Figure 19:
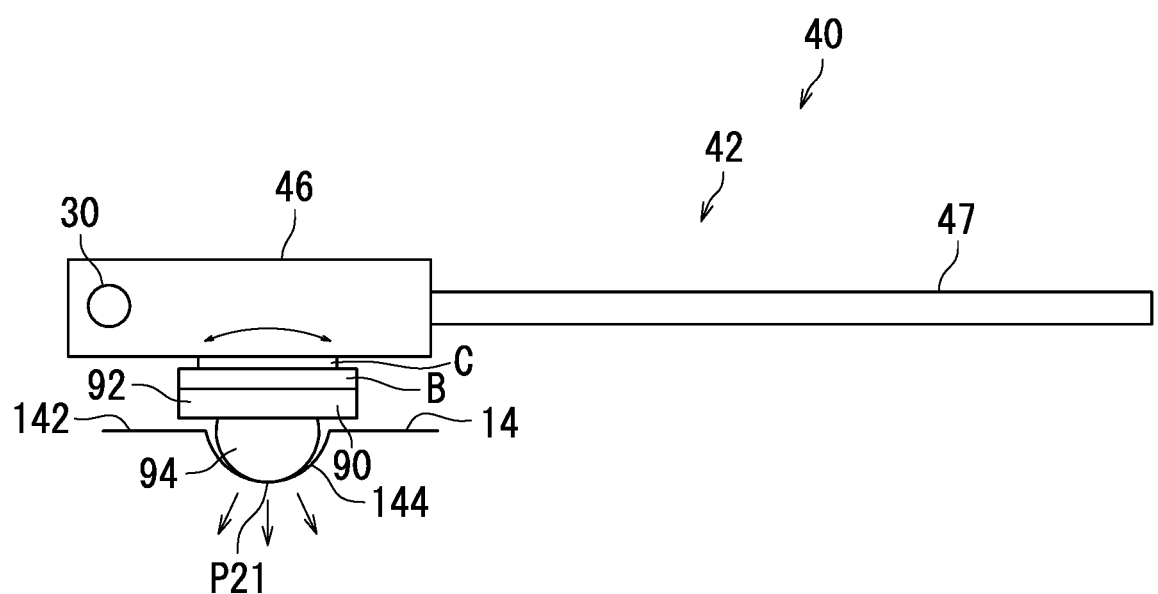
FIG. 19 is a schematic side view of a pressing section according to another embodiment of the present invention.

In the bonding devices 100 described with reference to FIGS. 1 to 18, the pressing sections 40 have the pressers 43 that come in point contact. Alternatively, the pressing sections 40 do not need to have the pressers 43 that come in point contact. FIG. 19 is a schematic side view of one pressing section 40 according to another embodiment of the present invention. In FIG. 19, a contact point P21 is a point of contact between a substrate supporting member 90 and a reference surface 142. Description is omitted for elements of the bonding device 100 illustrated in FIG. 19 that are the same as those of the bonding devices 100 described with reference to FIGS. 1 to 18.

The pressing section 40 illustrated in FIG. 19 has the arm 42 and the substrate supporting member 90. The substrate supporting member 90 supports the substrate B. The substrate supporting member 90 has a flat section 92 and a semispherical section 94. The flat section 92 is flat. The semispherical section 94 is semispherical. The support base 14 has the reference surface 142. The reference surface 142 has a recessed section 144. The substrate supporting member 90 is disposed on the reference surface 142. Specifically, a portion of the semispherical section 94 is disposed in the recessed section 144. The substrate supporting member 90 is movably supported by the recessed section 144. The recessed section 144 has suction holes. The substrate supporting member 90 can be fixed by being sucked on through the suction holes by a suction mechanism.

For bonding the components C to the substrate B, first, the substrate B and the components C are placed on the substrate supporting member 90. Subsequently, the arms 42 are pivoted to press the components C. The substrate supporting member 90 then becomes stable in a position where uniform load is applied to the entire area of each component C. The substrate supporting member 90 in this state is in point contact with the reference surface 142 at the contact point P21. Once the substrate supporting member 90 is stable in the position, the substrate supporting member 90 is sucked on through the suction holes by the suction mechanism to be fixed.

The bonding device 100 described with reference to FIG. 19 bonds the components C to the substrate B through point contact between the substrate supporting member 90 and the reference surface 142. It is therefore possible to apply uniform pressure to the entire area of each component C.

Through the above, embodiments of the present invention have been described with reference to the drawings (FIGS. 1 to 19). However, the present invention is not limited to the above embodiments and may be implemented in various different forms that do not deviate from the essence of the present invention (for example, as described below in (1) and (2)). The drawings schematically illustrate elements of configuration in order to facilitate understanding and properties of elements of configuration illustrated in the drawings, such as thickness, length, and number thereof, may differ from actual properties thereof in order to facilitate preparation of the drawings. Furthermore, properties of elements of configuration described in the above embodiments, such as materials, shapes, and dimensions, are merely examples and are not intended as specific limitations. Various alterations may be made so long as there is no substantial deviation from the effects of the present invention.

(1) As described with reference to FIGS. 1 to 19, the pressers 43 of the bonding device 100 are made from a fluororesin such as TEFLON (registered Japanese trademark). However, the present invention is not limited as such. For example, the pressers 43 may be formed from ceramics or a metal material. In a configuration in which the pressers 43 are formed from ceramics or a metal material, bonding can be performed through sintering at a higher temperature than in a configuration in which the pressers 43 are formed from TEFLON (registered Japanese trademark).

(2) As described with reference to FIGS. 1 to 19, the pressing sections 40 of the bonding device 100 have the weights 45. However, the present invention is not limited as such. For example, the pressing sections 40 may have no weights 45. In such a configuration, pressure can be applied to the components C by self-weight of the arms 42. Furthermore, the arms 42 can be detached to perform pressureless bonding.

REFERENCE SIGNS LIST

14 Support base
20 Wall section
30 Rotational shaft
32 Arm attachment section
40 Pressing section
40a First pressing section
40b Second pressing section
42 Arm
43 Presser
44 Pressing surface
45 Weight
46 Rotational shaft holding section
49b, 49c Opening
50 Contact section
52 Connection movable section
54a First end movable section (movable section)
54b Second end movable section (movable section)
70 Arm movement restriction section
90 Substrate supporting member
100 Bonding device
142 Reference surface
322 Arc-shaped section
324 Flat section
492 Arc-shaped section
494 First flat section
496 Second flat section
B Substrate
C Component
H Guide hole
M Metal material

The invention claimed is:
1. A bonding device for bonding at least one component to a substrate using a metal material, the bonding device comprising:
a wall section;
at least one pressing section; and
a rotational shaft fixed to the wall section, wherein
the at least one pressing section has:
an arm extending from the rotational shaft and configured to pivot about the rotational shaft; and
a presser configured to press the at least one component or a substrate supporting member disposed on a reference surface and configured to support the substrate,
the bonding device bonds the at least one component to the substrate through point contact of the presser with the at least one component, point contact of the presser with the arm, or point contact of the substrate supporting member with the reference surface,
the at least one pressing section further has a weight attached to the arm,
the presser is located between the rotational shaft and the weight,
the arm has:
a rotational shaft holding section which holds the rotational shaft; and
a weight attachment section connected to the rotational shaft holding section and to which the weight is attached,
the weight attachment section is rod-shaped, and
the weight has:
a through hole to which the weight attachment section is insertable; and
a screw hole to which a screw is insertable.
2. The bonding device according to claim 1, wherein
the presser has a pressing surface that presses the at least one component, and
the pressing surface is downwardly convex.

3. The bonding device according to claim 2, wherein the pressing surface is a portion of a spherical surface.

4. The bonding device according to claim 1, wherein the bonding device bonds the at least one component to the substrate through point contact of the presser with a central region of the at least one component.

5. The bonding device according to claim 1, wherein the arm is attachable to and detachable from the rotational shaft.

6. The bonding device according to claim 5, wherein the rotational shaft has an arm attachment section to which the arm is attached,
the arm attachment section has a cylindrical shape having a cutaway portion,
the arm is attached to the arm attachment section,
a peripheral surface of the arm attachment section has:
　an arc-shaped section; and
　a flat section connected with the arc-shaped section,
the arm has a rotational shaft holding section,
the rotational shaft holding section has:
　an arc-shaped section;
　a first flat section connected with one end of the arc-shaped section of the rotational shaft holding section; and
　a second flat section connected with another end of the arc-shaped section of the rotational shaft holding section,
a diameter of a circle defining the arc-shaped section of the arm attachment section is greater than a distance between the first flat section of the rotational shaft holding section and the second flat section of the rotational shaft holding section, and
a length obtained as a sum of a radius of the circle defining the arc-shaped section of the arm attachment section and a shortest distance from a center of the circle defining the arc-shaped section of the arm attachment section to the flat section of the arm attachment section is equal to or shorter than the distance between the first flat section of the rotational shaft holding section and the second flat section of the rotational shaft holding section.

7. The bonding device according to claim 6, wherein the rotational shaft further has a pair of arm movement restriction sections configured to restrict movement of the arm in an axial direction of the rotational shaft, and
the arm attachment section is defined by the pair of arm movement restriction sections.

8. The bonding device according to claim 1, further comprising
a support base configured to support the substrate, wherein
the support base fixes a position of the substrate, and
the support base has a higher thermal conductivity than the arm.

9. The bonding device according to claim 1, wherein an extending direction of the arm is parallel to a horizontal direction when the presser is in point contact with the at least one component.

10. The bonding device according to claim 1, wherein the presser is an elastic body.

11. The bonding device according to claim 10, wherein the elastic body includes a fluororesin.

12. The bonding device according to claim 1, wherein the at least one component comprises a plurality of components,
the at least one pressing section comprises a plurality of pressing sections, and
each of the pressing sections presses a corresponding one of the components.

13. The bonding device according to claim 1, wherein the at least one pressing section comprises a first pressing section and a second pressing section, and
the arm of the second pressing section has an opening that allows the presser of the first pressing section to pass therethrough.

14. The bonding device according to claim 1, wherein the arm further has a contact section configured to come in contact with the presser,
the contact section has a movable section that is movable about a fixed point, and
the bonding device bonds the at least one component to the substrate through point contact of the presser with the movable section.

\* \* \* \* \*